(12) United States Patent
Iwayama

(10) Patent No.: US 8,339,841 B2
(45) Date of Patent: Dec. 25, 2012

(54) MAGNETORESISTIVE ELEMENT INCLUDING UPPER ELECTRODE HAVING HEXAGONAL CROSS-SECTION SHAPE AND METHOD OF MANUFACTURING THE SAME

(75) Inventor: Masayoshi Iwayama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 12/704,157

(22) Filed: Feb. 11, 2010

(65) Prior Publication Data

US 2010/0200900 A1 Aug. 12, 2010

(30) Foreign Application Priority Data

Feb. 12, 2009 (JP) ................................ 2009-030105

(51) Int. Cl.
*H01L 29/82* (2006.01)

(52) U.S. Cl. ............. 365/158; 257/295; 365/171; 438/3

(58) Field of Classification Search .................. 365/158, 365/171; 257/295; 438/3
See application file for complete search history.

(56) References Cited

U.S. PATENT DOCUMENTS

| | | | |
|---|---|---|---|
| 6,258,283 B1 | 7/2001 | Mikami et al. | |
| 6,965,138 B2 | 11/2005 | Nakajima et al. | |
| 7,307,306 B2 | 12/2007 | Yates et al. | |
| 2002/0064005 A1 | 5/2002 | Arasawa et al. | |
| 2003/0193762 A1* | 10/2003 | Hayashi et al. | 360/324.12 |
| 2004/0027733 A1* | 2/2004 | Matsukawa et al. | 360/324.2 |
| 2005/0248980 A1* | 11/2005 | Han et al. | 365/171 |
| 2006/0103989 A1* | 5/2006 | Hayakawa | 360/324.1 |
| 2006/0262457 A1* | 11/2006 | Hirata et al. | 360/319 |
| 2007/0123023 A1* | 5/2007 | Kim et al. | 438/618 |
| 2008/0265347 A1* | 10/2008 | Iwayama et al. | 257/421 |
| 2008/0291720 A1* | 11/2008 | Wang et al. | 365/173 |
| 2010/0097846 A1* | 4/2010 | Sugiura et al. | 365/158 |
| 2010/0220524 A1* | 9/2010 | Mani et al. | 365/171 |

FOREIGN PATENT DOCUMENTS

| | | |
|---|---|---|
| JP | 11-274600 | 8/1999 |
| JP | 11-274600 | 10/1999 |
| JP | 2002-170211 | 6/2002 |
| JP | 2005-044848 | 2/2005 |
| JP | 2005-44848 A | 2/2005 |
| JP | 2006-086322 | 3/2006 |
| JP | 2007-329340 | 12/2007 |
| JP | 2009-152444 | 7/2009 |

OTHER PUBLICATIONS

Background Art Information.
Japanese Office Action dated Feb. 28, 2012 for Japanese Application No. 2009-030105 filed on Feb. 12, 2009.

* cited by examiner

*Primary Examiner* — Fernando L Toledo
*Assistant Examiner* — Peter Bradford
(74) *Attorney, Agent, or Firm* — Knobbe, Martens, Olson & Bear, LLP

(57) ABSTRACT

A magnetoresistive element of an aspect of the present invention including a lower electrode provided on an insulating layer on a semiconductor substrate, a first ferromagnetic layer provided on the lower electrode, a first tunnel barrier layer provided on the first ferromagnetic layer, a second ferromagnetic layer provided on the first tunnel barrier layer, and an upper electrode provided on the second ferromagnetic layer, wherein the upper electrode has a hexagonal cross-sectional shape, and a maximum size of the upper electrode in a first direction is larger than a size of the first tunnel barrier layer in the first direction, the first direction being horizontal relative to a surface of the semiconductor substrate.

13 Claims, 15 Drawing Sheets

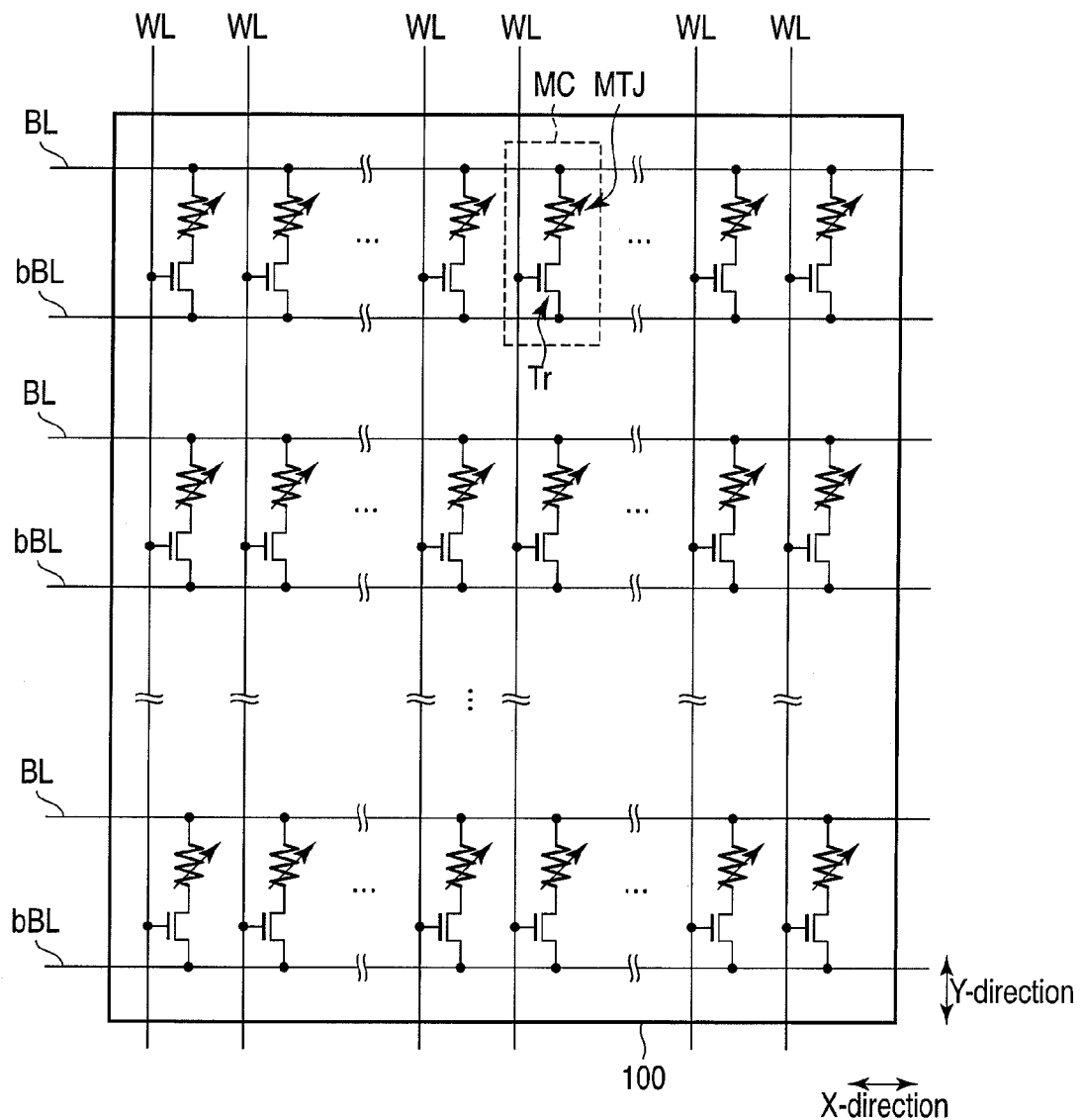
F I G. 1

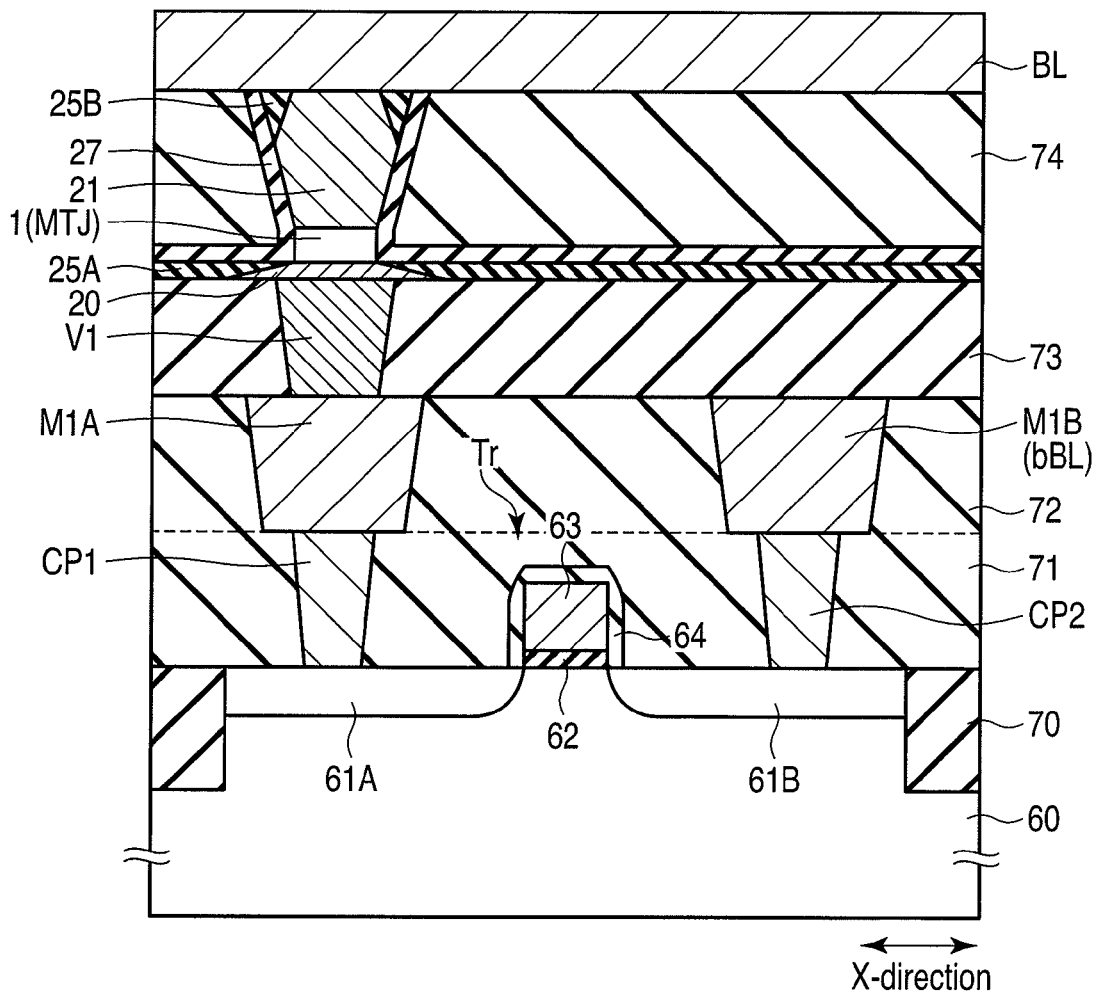
F I G. 2

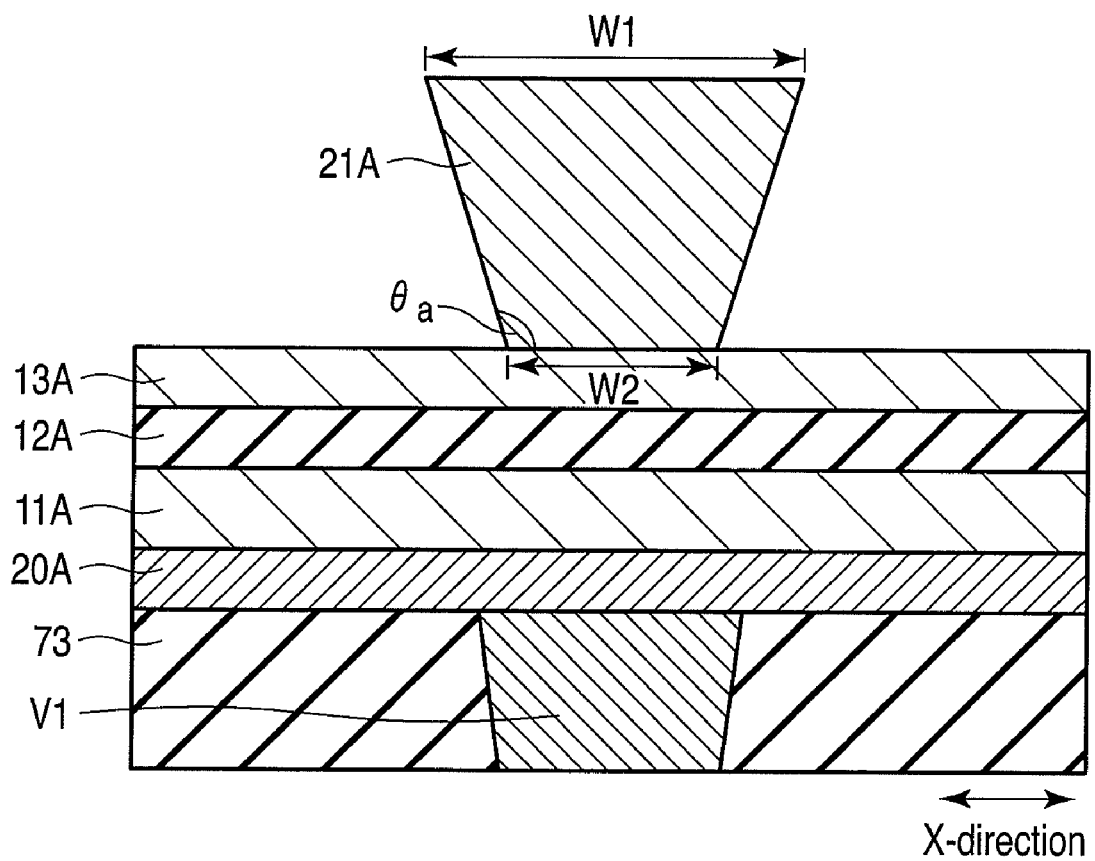
F I G. 7

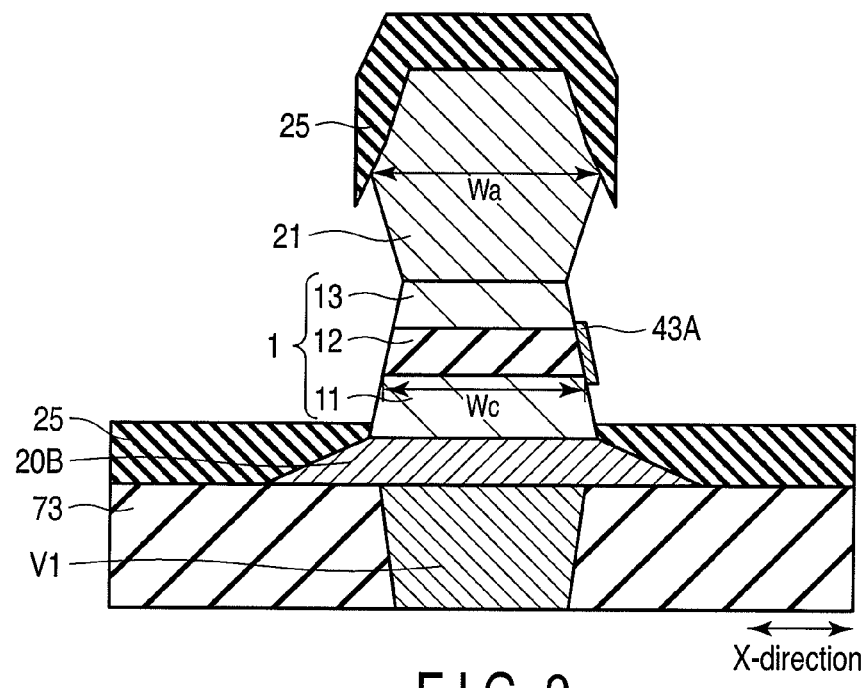
F I G. 9
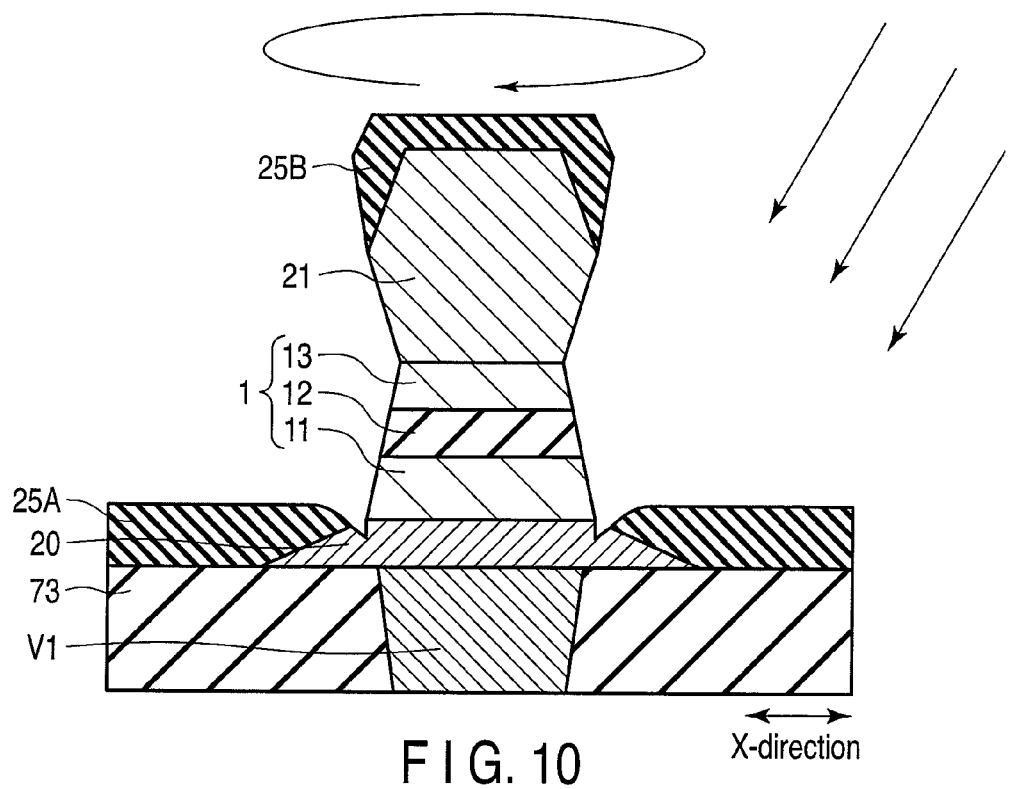
F I G. 10

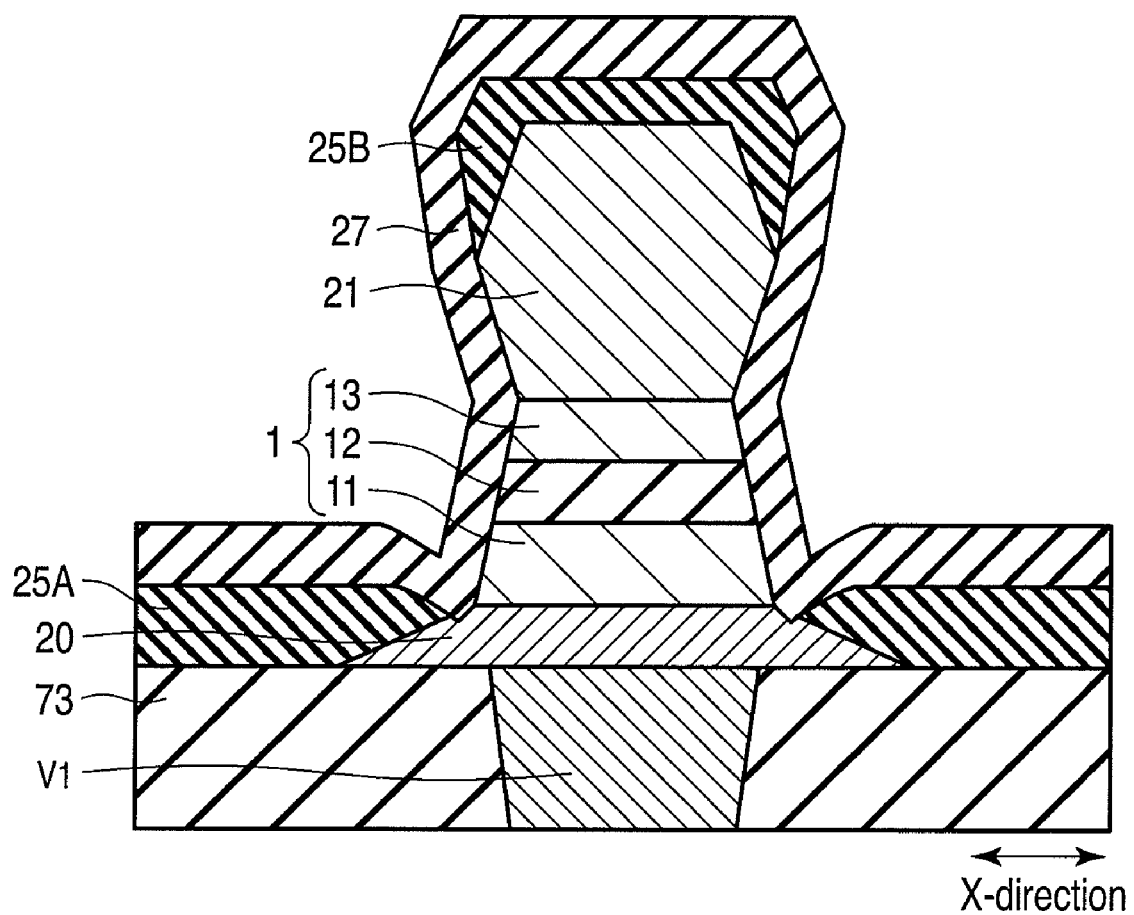
F I G. 11

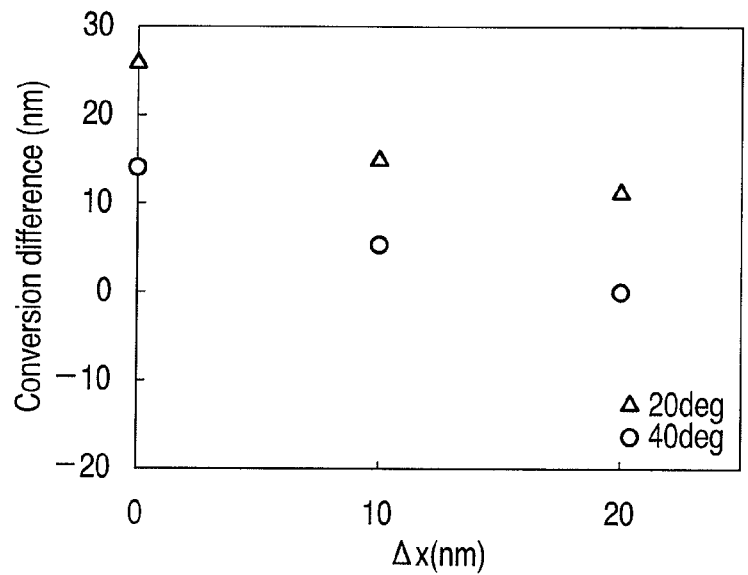
F I G. 13
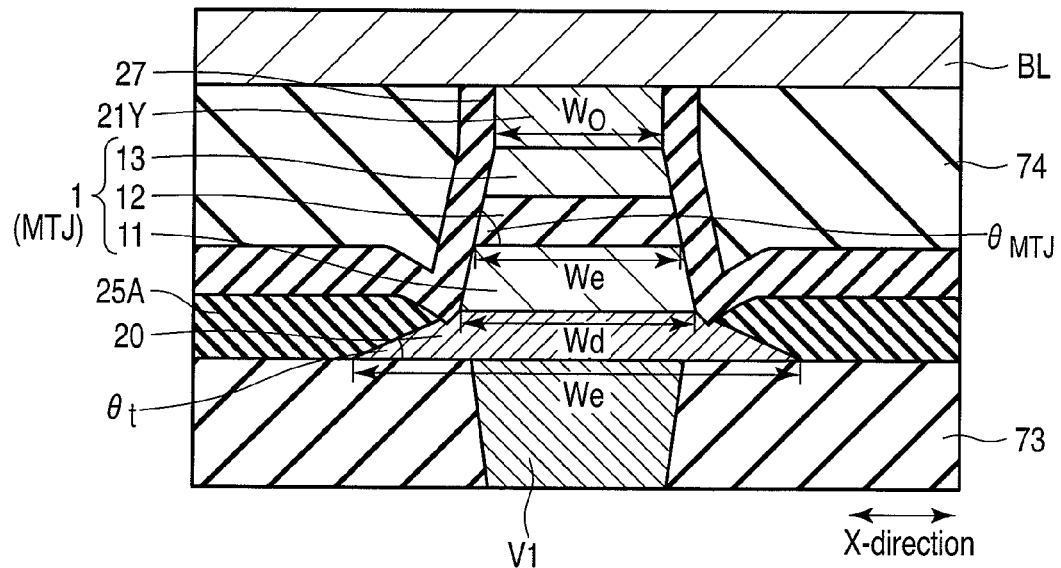
F I G. 14

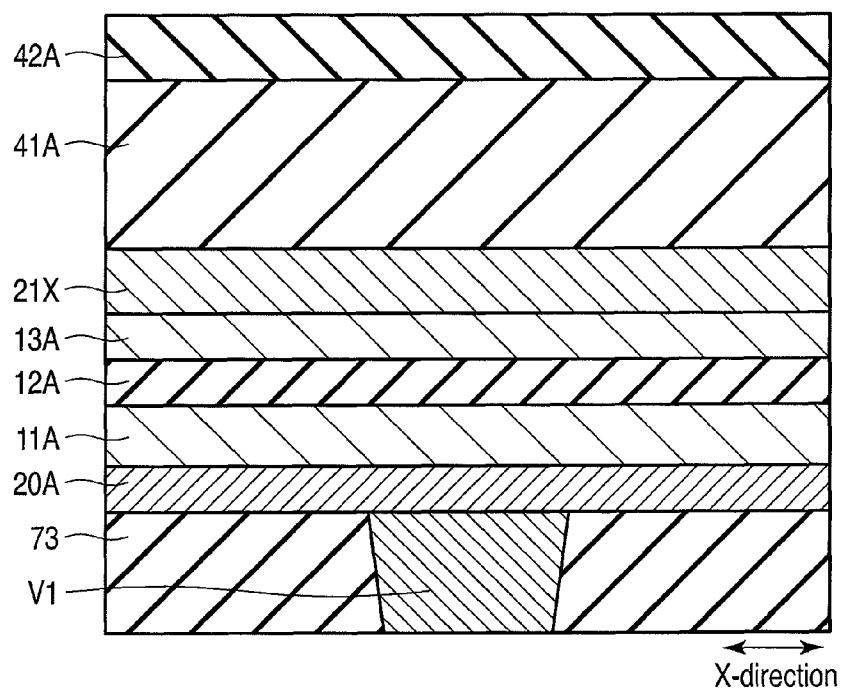
F I G. 15
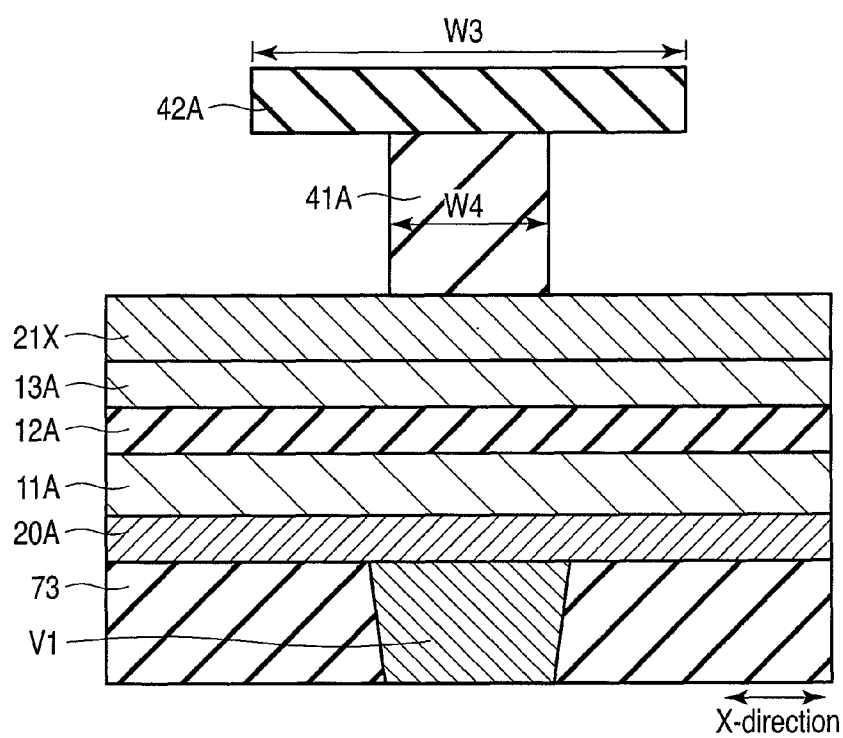
F I G. 16

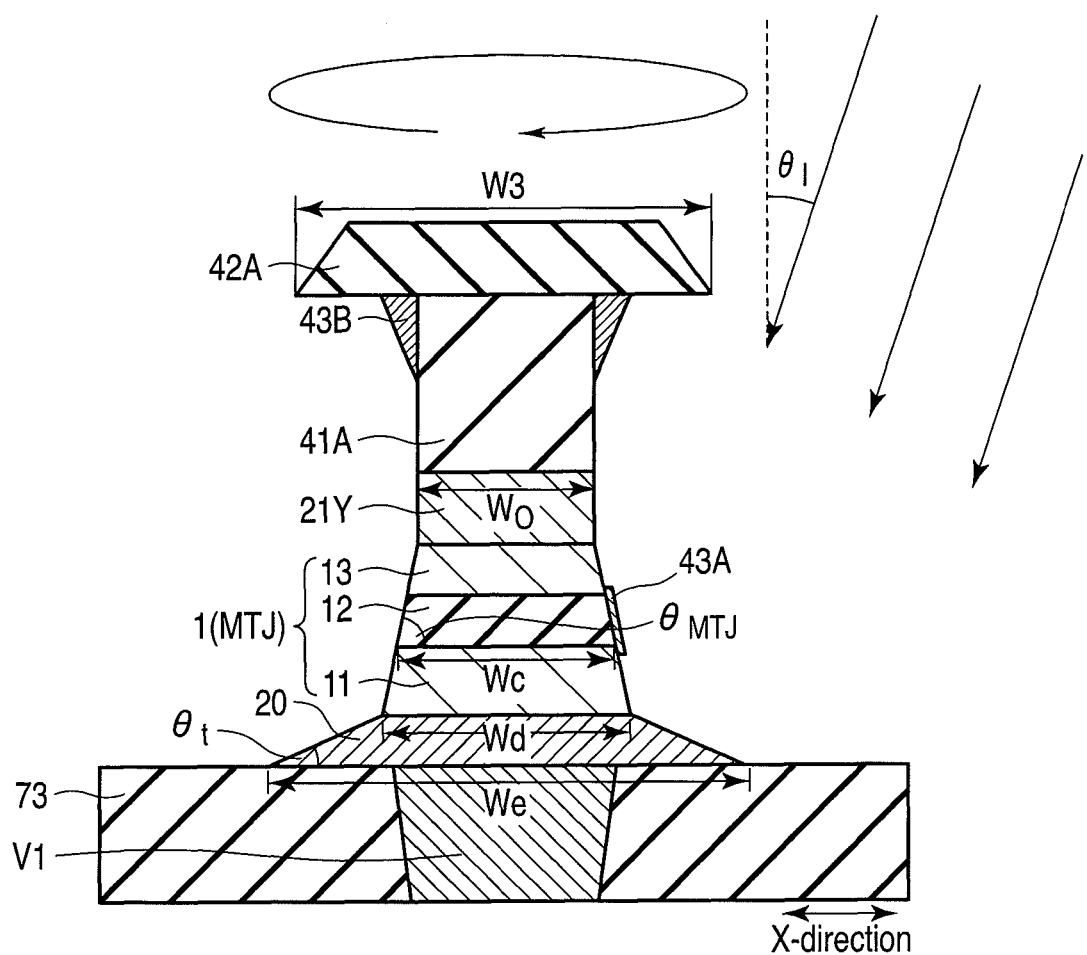
F I G. 17

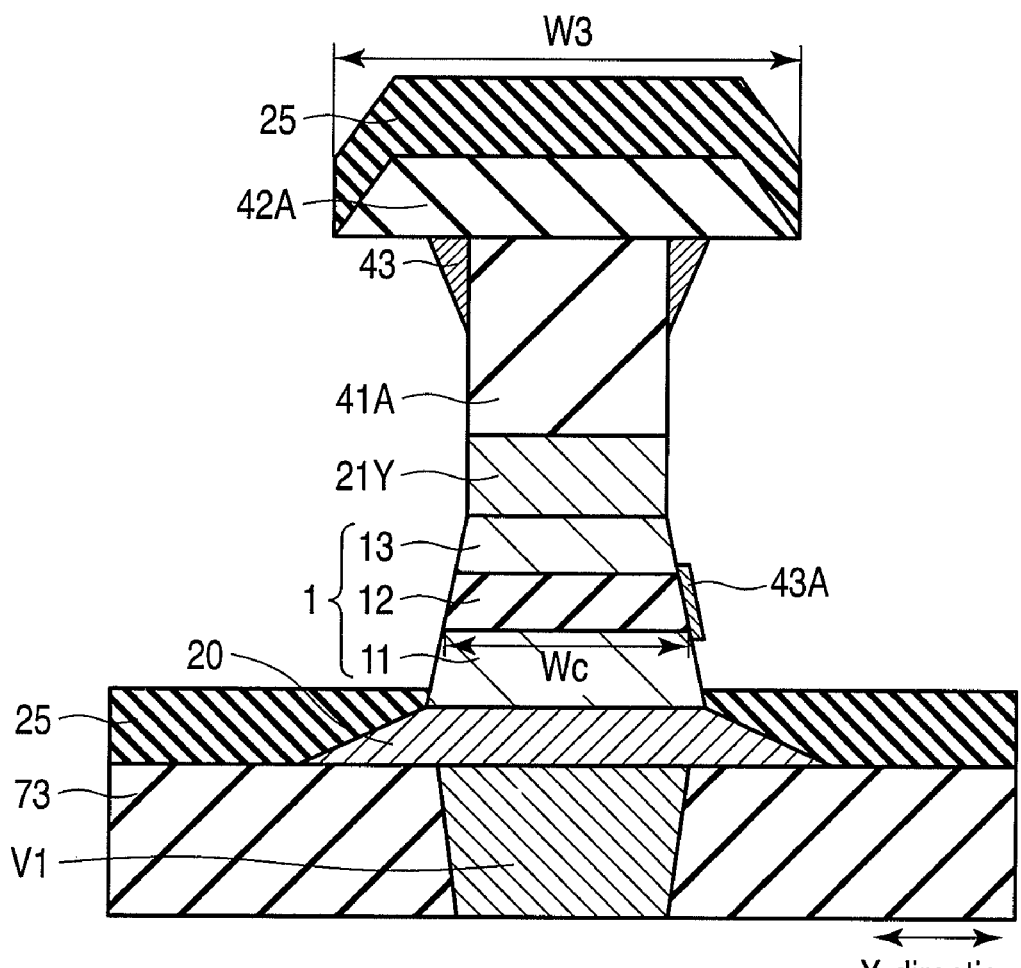
F I G. 18

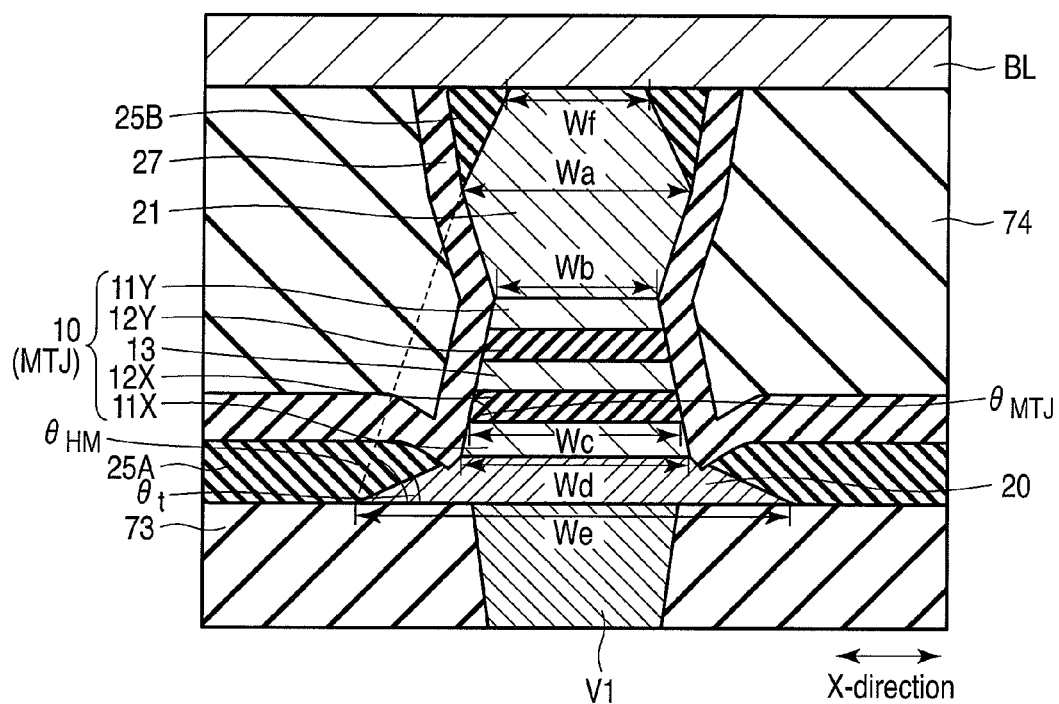
F I G. 20

US 8,339,841 B2

MAGNETORESISTIVE ELEMENT INCLUDING UPPER ELECTRODE HAVING HEXAGONAL CROSS-SECTION SHAPE AND METHOD OF MANUFACTURING THE SAME

CROSS-REFERENCE TO RELATED APPLICATIONS

This application is based upon and claims the benefit of priority from prior Japanese Patent Application No. 2009-030105, filed Feb. 12, 2009, the entire contents of which are incorporated herein by reference.

BACKGROUND OF THE INVENTION

1. Field of the Invention

The present invention relates to a magnetoresistive element and a method of manufacturing the magnetoresistive element.

2. Description of the Related Art

A magnetoresistive random access memory (MRAM) is a nonvolatile semiconductor memory which stores data using a variation in resistance of a magnetoresistive element due to a change in relative relationship between directions of magnetization of two ferromagnetic layers included in the magnetoresistive element.

A memory cell of an MRAM includes a magnetoresistive element in which a plurality of ferromagnetic layers and a barrier layer are laminated. The magnetoresistive element comprises a ferromagnetic layer whose magnetization direction is pinned (hereinafter referred to as a "magnetic pinned layer" or a "reference layer") and a ferromagnetic layer whose magnetization direction is variable (hereinafter referred to as a "magnetic free layer" or a "storage layer"). By varying the magnetization direction of this magnetic free layer, data is written.

In an MRAM in which data is written using a magnetic field generated by a current flowing through an interconnect (magnetic field write type MRAM), if the size of a magnetoresistive element is reduced, the coercive force between ferromagnetic layers is increased, leading to a tendency of increasing a current required for writing. With the magnetic field write type MRAM, it is difficult both to achieve miniaturization of a memory cell toward an increase in capacity and to reduce power consumption of the memory cell.

As a write method to overcome such a problem, a spin transfer MRAM using the spin transfer torque (STT) write method has been proposed.

In the spin transfer MRAM, writing of data is carried out by passing a spin-polarized current having a given value or more from one end of a magnetoresistive element to the other end, or from the other end of the magnetoresistive element to one end, to vary the direction of magnetization of the magnetic free layer.

In a method of manufacturing an MRAM, constitution members, interconnects and electrodes of a magnetoresistive element are processed using, for example, ion milling.

Ion milling is a method of processing a member by physical sputtering. Upon the processing, the processed substance sometimes adheres as a residue to a constitution member of the magnetoresistive element. If the residue is electrically conductive, the residue causes a short circuit between two ferromagnetic layers, which sandwich a tunnel barrier layer, and the tunnel barrier layer. This is a cause of failure of the magnetoresistive element and an MRAM using it. Particularly in a spin transfer MRAM, a current is passed through a magnetoresistive element, and therefore the current flows between two ferromagnetic layers via the conductive residue to make writing of data impossible.

An example of techniques to solve this problem is disclosed in Jpn. Pat. Appln. KOKAI Publication No. 2005-44848. In Jpn. Pat. Appln. KOKAI Publication No. 2005-44848, however, an effect of removing the residue from a side surface of a magnetoresistive element is not sufficiently obtained unless a taper angle formed between the side surface and the bottom surface of the magnetoresistive element is 60° or less. As a result, the size of the formed magnetoresistive element cannot be reduced. Arranging a plurality of magnetoresistive elements with high density becomes difficult.

BRIEF SUMMARY OF THE INVENTION

A magnetoresistive element of an aspect of the present invention comprising: a lower electrode provided on an insulating layer on a semiconductor substrate; a first ferromagnetic layer provided on the lower electrode; a first tunnel barrier layer provided on the first ferromagnetic layer; a second ferromagnetic layer provided on the first tunnel barrier layer; and an upper electrode provided on the second ferromagnetic layer, wherein the upper electrode has a hexagonal cross-sectional shape, and a maximum size of the upper electrode in a first direction is larger than a size of the first tunnel barrier layer in the first direction, the first direction being horizontal relative to a surface of the semiconductor substrate.

A method of manufacturing a magnetoresistive element of an aspect of the present invention, comprising: forming a conductive layer on an insulating layer on a semiconductor substrate; sequentially forming a first ferromagnetic layer, a tunnel barrier layer and a second ferromagnetic layer on the conductive layer; forming on the second ferromagnetic layer a hard mask with a size on a bottom surface side smaller than a size on a top surface side; processing the second ferromagnetic layer, the tunnel barrier layer and the first ferromagnetic layer to form a magnetoresistive element, and processing the conductive layer to form a lower electrode of the magnetoresistive element, with the hard mask as a mask, using physical etching in which an ion is incident on a surface of the semiconductor substrate from an oblique direction; forming a first protective film which covers the lower electrode; and removing a residue adhering to a side surface of the magnetoresistive element.

BRIEF DESCRIPTION OF THE SEVERAL VIEWS OF THE DRAWING

FIG. 1 is an equivalent circuit diagram for explaining a configuration of a memory cell array;

FIG. 2 is a cross-sectional view showing a structure of a memory cell;

FIG. 7 is a cross-sectional view showing one process of manufacturing the magnetoresistive element according to the first embodiment;

FIG. 9 is a cross-sectional view showing one process of manufacturing the magnetoresistive element according to the first embodiment;

FIG. 10 is a cross-sectional view showing one process of manufacturing the magnetoresistive element according to the first embodiment;

FIG. 11 is a cross-sectional view showing one process of manufacturing the magnetoresistive element according to the first embodiment;

FIG. 13 is an explanatory diagram of en effect of the magnetoresistive element according to the first embodiment;

FIG. 14 is a cross-sectional view showing a structure of a magnetoresistive element according to a second embodiment;

FIG. 15 is a cross-sectional view showing one process of manufacturing the magnetoresistive element according to the second embodiment;

FIG. 16 is a cross-sectional view showing one process of manufacturing the magnetoresistive element according to the second embodiment;

FIG. 17 is a cross-sectional view showing one process of manufacturing the magnetoresistive element according to the second embodiment;

FIG. 18 is a cross-sectional view showing one process of manufacturing the magnetoresistive element according to the second embodiment;

FIG. 20 is a cross-sectional view showing a structure of a magnetoresistive element according to a third embodiment.

DETAILED DESCRIPTION OF THE INVENTION

Figure 3:
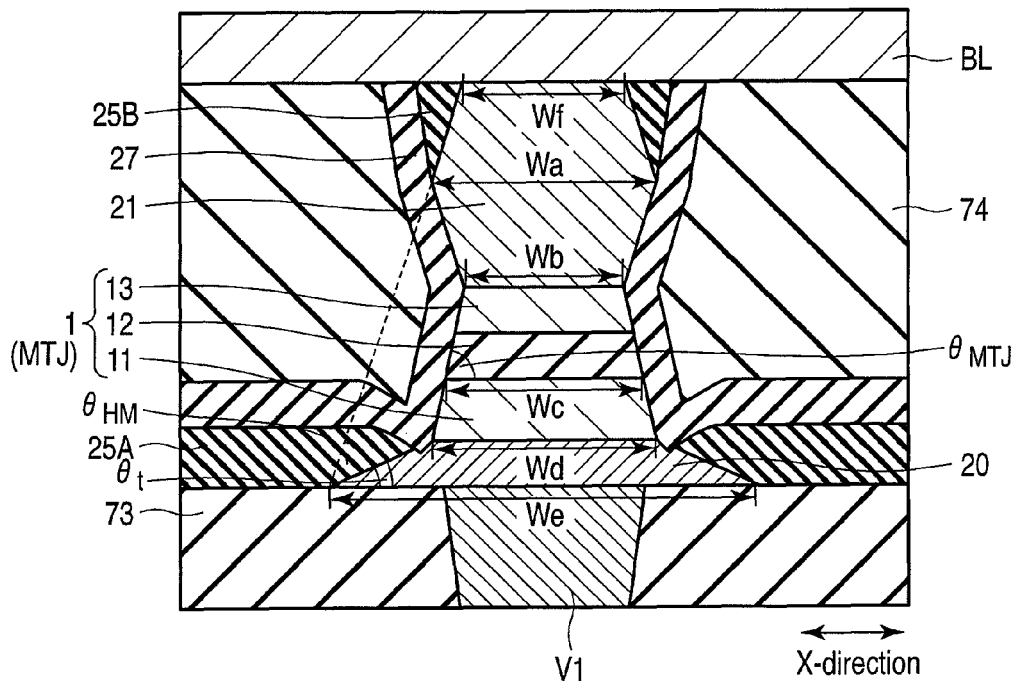
FIG. 3 is a cross-sectional view showing a structure of a magnetoresistive element according to a first embodiment.

Some embodiments for carrying out an example of the invention will be described in detail below with reference to the drawings.

1. First Embodiment

Referring to FIGS. 1 to 13, a first embodiment of the invention is described below.

(1) Structure

Referring to FIGS. 1 to 4, a structure of a magnetoresistive element according to the first embodiment of the invention is described.

FIG. 1 shows an equivalent circuit of a memory cell array of a magnetic random access memory (MRAM).

In a memory cell array 100, a plurality of bit lines BL and bBL extending in the X-direction and a plurality of word lines WL extending in the Y line are provided. Connected to one memory cell MC are one word line WL and two bit lines BL and bBL. The two bit lines BL and bBL form a pair of bit lines.

In the memory cell array 100, a plurality of memory cells MC are arranged in an array configuration. The plurality of memory cells MC arranged along the X-direction are commonly connected to a pair of bit lines BL and bBL. The plurality of memory cells MC arranged along the Y-direction are commonly connected to one word line WL.

Each of the memory cells MC comprises one magnetoresistive element MTJ and one select switching element Tr. The select switching element Tr is, for example, a field-effect transistor. Hereinafter, the select switching element Tr is referred to as a "select transistor Tr".

One end of the magnetoresistive element MTJ is connected to one bit line BL of a pair of bit lines. The other end of the magnetoresistive element MTJ is connected to one end of the current path of the select transistor Tr. The other end of the current path of the select transistor Tr is connected to the other bit line bBL of the pair of bit lines. A control terminal (gate) of the select transistor Tr is connected to a word line WL.

The magnetoresistive element MTJ comprises, for example, a ferromagnetic layer (magnetic pinned layer or reference layer) whose magnetization direction is invariable, a ferromagnetic layer (magnetic free layer or storage layer) whose magnetization direction is variable, and a tunnel barrier layer sandwiched by the ferromagnetic layers. The magnetoresistive element MTJ can be in two steady states in which the magnetization directions of the two ferromagnetic layers are parallel or antiparallel. By causing one of the two states to correspond to "0" data and the other to correspond to "1" data, binary data is stored.

Writing of data to the magnetoresistive element MTJ is carried out, for example by passing a write current in which electrons are spin-polarized (hereinafter referred to as a "spin-polarized current") between a pair of bit lines BL and bBL. The magnitude of the spin-polarized current is greater than or equal to a current required to reverse the magnetization direction of a magnetic free layer. During writing of data, the spin-polarized current flows from one end of a magnetoresistive element to the other end, or from the other end of the magnetoresistive element to one end. This varies relative magnetization directions of the magnetic free layer and the magnetic pinned layer in the magnetoresistive element MTJ.

Reading data from the magnetoresistive element MTJ is carried out by passing a current (read current) smaller than the write current between a pair of the bit lines BL and bBL. By passing the read current to the magnetoresistive element MTJ, potentials of the bit lines BL and bBL vary in accordance with a resistance (data) corresponding to a steady state (parallel/antiparallel) of the element. By detecting the potential variation, data is read.

FIG. 2 is a cross-sectional view showing a structure of one memory cell MC. In FIG. 2, a cross-sectional structure along the extending direction of the bit line (X-direction) is shown.

In a semiconductor substrate 60, an isolation insulating film 70 is buried, so that an element formation region partitioned by the isolation insulating film 70 is provided.

The select transistor Tr is provided in the element formation region. In the semiconductor substrate 60 serving as the element formation region, two diffusion layers 61A and 61B are provided. The two diffusion layers 61A and 61B become source/drain regions of the transistor Tr. Provided on the surface of the semiconductor substrate (channel region) 60 between the two diffusion layers (hereinafter referred to as "source/drain diffusion layers") is a gate insulating film 62. A gate electrode 63 is provided on the gate insulating film 62. The gate electrode 63 extends in the Y-direction, and is used commonly for a plurality of select transistors arranged in the Y-direction, functioning as a word line. On the side surfaces and the top surface of the gate electrode 63, for example, an insulating film 64 is provided.

Provided on the source/drain diffusion layers 61A and 61B are contact plugs CP1 and CP2. Connected to the contact plugs CP1 and CP2 are interconnects M1A and M1B. The contact plugs CP1 and CP2 and the interconnects M1A and M1B are buried in the first and second interlayer insulating films 71 and 72. The interlayer insulating films 71 and 72 are provided on the semiconductor substrate 60 to cover the select transistor Tr.

Provided on the interlayer insulating films 71 and 72 is a third interlayer insulating film 73. In the interlayer insulating film 73, a via plug V1 is buried, and the via plug V1 is connected to the interconnect M1A.

Provided on the top surface of the via plug V1 is a lower electrode 20. Provided on the side surface of the lower electrode 20 is a first protective film 25A.

The magnetoresistive element 1 is provided on the top surface of the lower electrode 20. Provided on the magnetoresistive element 1 is an upper electrode 21. The side surface of the magnetoresistive element 1 is covered with a second protective film 27. Note that provided on an upper side surface of the upper electrode 21 is an insulating film 25B made of the same material as that of the first protective film 25A.

Provided on the protective film 27 is a fourth interlayer insulating film 74. Provided on the upper electrode 21 and the interlayer insulating film 74 is a bit line BL. The bit line BL extends in the X-direction and is used commonly for a plurality of memory cells adjacent to one another in the X-direction.

One end of the magnetoresistive element 1 is connected via the lower electrode 20, the via plug V1, the interconnect M1A and the contact plug CP1 to the source/drain diffusion layer (one end of the current path) 61A of the select transistor Tr.

The other end of the magnetoresistive element 1 is connected via the upper electrode 21 to the bit line BL.

The bit line bBL, which is paired with the bit line BL, is connected via the interconnect M1B and a contact plug CP2 to the source/drain diffusion layer (other end of the current path) 61B of the select transistor Tr, for example, using an interconnect (not shown) led in the front or back direction in FIG. 2.

In this way, the magnetoresistive element 1 is disposed on an interconnect layer in which, for example, the interconnect M1A and the interlayer insulating films 71 to 73 are laminated.

Note that, for example, a stopper film is provided at each of positions between the interlayer insulating films 71 to 74, but is not shown in this embodiment.

While the lower electrode 20 is directly in contact with the via plug V1 in this embodiment, the positional relationship is not limited to this example, and a metal layer may be provided between the lower electrode 20 and the via plug V1. While the magnetoresistive element 1 is disposed above the source/drain diffusion layer 61A of the select transistor Tr, the magnetoresistive element 1 may be disposed above the gate electrode 63 of the select transistor Tr using a leading interconnect.

FIG. 3 is a cross-sectional view showing a structure of a magnetoresistive element according to the first embodiment of the invention.

As shown in FIG. 3, the magnetoresistive element 1 is provided between the lower electrode 20 and the upper electrode 21.

The magnetoresistive element 1 has, for example, a structure in which one tunnel barrier layer 12 is sandwiched by two ferromagnetic layers 11 and 13. The first ferromagnetic layer 11 is provided on the lower electrode 20. Provided on the ferromagnetic layer 11 is the tunnel barrier layer 12. Provided on the tunnel barrier layer 12 is the second ferromagnetic layer 13. The magnetoresistive element 1 according to this embodiment is so-called the MTJ element utilizing a magnetic tunnel junction.

For example, the magnetoresistive element 1 has a taper-shaped (trapezoid-shaped) cross-sectional structure. The size (width) Wb in the X-direction of the top surface (upper electrode side) of the second ferromagnetic layer 13 is smaller than the size (width) Wd in the X-direction of the bottom surface (lower electrode side) of the first ferromagnetic layer 11. Note that the X-direction is a direction being horizontal with respect to the surface of the semiconductor substrate.

Figure 4:
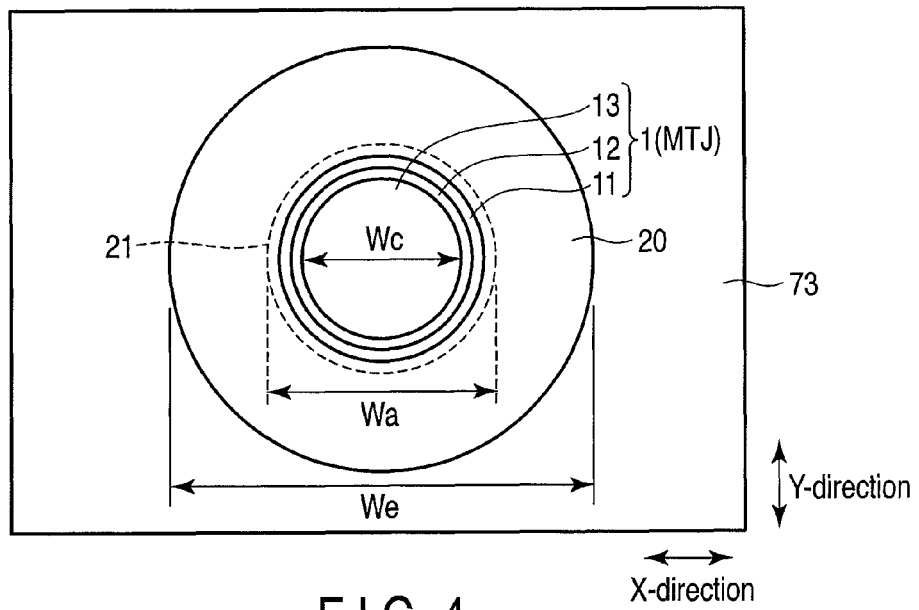
FIG. 4 is a plan view showing a structure of the magnetoresistive element according to the first embodiment.

As shown in FIG. 4, the magnetoresistive element 1 has, for example, a circular, planar shape. However, the planar shape of the magnetoresistive element 1 is not limited to a circle, and may be another shape such as an oval.

The magnetoresistive element 1 may be an in-plane magnetization type magnetoresistive element in which the magnetization directions of the two ferromagnetic layers 11 and 13 are in parallel to the film surfaces, and may also be a perpendicular magnetization type magnetoresistive element in which the magnetization directions of the two ferromagnetic layers 11 and 13 are perpendicular to the film surfaces.

Of the two ferromagnetic layers 11 and 13, one ferromagnetic layer has a fixed magnetization direction, and the other ferromagnetic layer has a magnetization direction which is reversed by an external magnetic field or STT. Hereinafter a ferromagnetic layer whose magnetization direction is fixed and in which the orientation of magnetization is not varied is referred to as a "magnetic pinned layer" or a "reference layer", and a ferromagnetic layer whose magnetization direction is varied is referred to as a "magnetic free layer" or a "storage layer". For example, in this embodiment, the ferromagnetic layer 11 is a magnetic pinned layer, and the ferromagnetic layer 13 is a magnetic free layer.

In the magnetoresistive element 1, for example, $Al_2O_3$, $SiO_2$, MgO, AlN, $Bi_2O$, $MgF_2$ or $SrTiO_2$ is used as a material of the tunnel barrier layer 12.

In the case of the magnetoresistive element 1 of the in-plane magnetization type, the following ferromagnetic materials are used as a material of which the ferromagnetic layers 11 and 13 are made. For example, a single-layer film containing any one of iron (Fe), cobalt (Co), boron (B) and nickel (Ni), their laminated films, their laminated ferri-ferromagnetic layers and their alloys are mentioned. Oxides, such as magnetite, $CrO_2$ and $RXMnO_3$—Y (R: rare earth, X: Ca, Ba, Sr), and Heusler alloys, such as NiMnSb and PtMnSb, which have large spin polarizabilities may be used. In the case of the magnetoresistive element 1 of the perpendicular magnetization type, any one of, for example, disordered alloys, ordered alloys, intermetallic compounds, artificial lattices and ferri-magnetic materials is used as a material of which the ferromagnetic layers 11 and 13 are made.

The lower electrode 20 has, for example, a tapered cross-sectional shape. In the lower electrode 20, the size (width) Wd in the X-direction on a side in contact with the magnetoresistive element 1 (an upper electrode side) is smaller than the size (width) We in the X-direction on the bottom surface side, which is a side (semiconductor substrate side) opposite to the upper electrode side. The width We of the bottom surface of the lower electrode 20 is large. This ensures a large contact area between the lower electrode 20 and the via plug V1. Thus the contact resistance between the lower electrode 20 and the via plug V1 can be reduced. This allows currents, such as a write current and a read current, to flow in the magnetoresistive element 1 with good efficiency.

The upper electrode 21 has, for example, a hexagonal cross-sectional shape. In the upper electrode 21, the size (width) in the X-direction has a maximum value Wa between its top surface and its bottom surface. The size (width) of the bottom surface of the upper electrode 21 has, for example, a value Wb which is substantially equal to that of the size of the ferromagnetic layer 13. The size (width) Wf of the top surface of the upper electrode 21 may be the same as the size Wb of the bottom surface of the upper electrode 21, and may also be different from it. The cross-sectional shape of the upper electrode 21 is not limited to a hexagon, and may be polygonal or spherical.

The upper electrode 21 functions as an electrode for connecting the magnetoresistive element 1 and the interconnect (bit line BL), and is used, for example, as a mask in a process of forming the magnetoresistive element 1.

The magnetoresistive element 1 (MTJ) and the lower and upper electrodes 20 and 21 are covered with the protective films 25A, 25B and 27.

Provided on the inclined side surface of the lower electrode 20 is the first protective film 25A.

The second protective film 27 is provided such that it is directly in contact with the side surface of the magnetoresistive element 1. Therefore the side surface of the magnetoresistive element 1 is not covered with the protective film 25A. The end of a junction surface between the lower electrode 20 and the magnetoresistive element 1 is not covered, for example, with the protective film 25A, and is directly in contact with the protective film 27 such that the protective film 27 covers the end of the junction.

A portion lower than a portion having the maximum size (width) Wa in a cross section in the X-direction of the upper electrode 21 is covered with the protective film 27. In the cross section in the X-direction of the upper electrode 21, a portion upper than the portion having the maximum size Wa is covered with the third protective film 25B. The second protective film 27 is provided on the side surface of the protective film 25B. The material used for the protective film 25B is the same as that used for the protective film 25A.

In this embodiment, the maximum size (width) Wa in the X-direction of the upper electrode 21 is larger than a size (width) Wc in the X-direction of the tunnel barrier layer 12. For example, in cases where the magnetoresistive element 1 has a taper-shaped cross-sectional structure, the maximum width Wc of the tunnel barrier layer 12 is a size of the bottom surface of the tunnel barrier layer 12.

Here, in the magnetoresistive element 1 of this embodiment, an acute angle formed between the side surface of the tunnel barrier layer 12 and the bottom surface of the tunnel barrier layer 12 is referred to as a "taper angle (first angle) $\theta_{MTJ}$. The taper angle $\theta_{MTJ}$ is, for example, 60° or more and less than 90°. In the taper-shaped lower electrode 20, an acute angle formed between the side surface of the lower electrode 20 and the bottom surface of the lower electrode 20 is referred to as a taper angle (second angle) $\theta t$. An acute angle formed between a straight line joining an end of the bottom surface of the lower electrode 20 and an end of the top surface of the upper electrode 21, and the bottom surface of the lower electrode 20 is referred to as a taper angle (third angle) $\theta_{HM}$. In this embodiment, the angle $\theta_{HM}$ and the angle $\theta_{MTJ}$ are each greater than or equal to the angle $\theta t$. Note that, for example, the bottom surface of the tunnel barrier layer 12, the bottom surface of the lower electrode 20, and the surface of the interlayer insulating film 73 are in horizontal directions relative to the surface of the semiconductor substrate, which are approximately in parallel to one another.

The magnetoresistive element of this embodiment is characterized in that the maximum size Wa along the X-direction of the upper electrode 21 is larger than the size Wc along the X-direction of the tunnel barrier layer 12 of the magnetoresistive element.

As in this embodiment, the size Wa in the X-direction of the upper electrode 21 being larger than the size Wc in the X-direction of the tunnel barrier layer 12 allows a residue adhering to the side surface of the magnetoresistive element to be removed even if the taper angle $\theta_{MTJ}$ of the magnetoresistive element is greater than or equal to 60°. The details thereof is to be described later.

The taper angle $\theta_{MTJ}$ of the magnetoresistive element (tunnel barrier layer) can be 60° or more and less than 90°. This can contribute to miniaturization of the magnetoresistive element and high density of the memory cell array.

Accordingly, with the magnetoresistive element according to the first embodiment of the invention, improvement in reliability is compatible with device miniaturization.

(2) Manufacturing Method

Referring to FIGS. 2, 3, and 6 to 12, a method of manufacturing a magnetoresistive element according to the first embodiment of the invention is described below. Note that FIGS. 2, 3, and 6 to 12 each show a cross section along the X-direction of a memory cell.

Initially, as shown in FIG. 2, the select transistor Tr included in the memory cell MC is formed on the semiconductor substrate 60. Referring to FIG. 2, a process of forming the select transistor Tr is described.

The isolation insulating film 70 in a shallow trench isolation (STI) structure is buried in the semiconductor substrate 60 so as to form an isolation region. With the isolation region, an element formation region is partitioned. The insulating film 62 functioning as a gate insulating film is formed on the semiconductor substrate (element formation region) 60. The insulating film is a silicon oxide film formed, for example, by the thermal oxidation method.

Next, a conductive layer is formed on the insulating film 62, for example, by the chemical vapor deposition (CVD) method. The conductive layer is processed into a given pattern using a photolithography technique and reactive ion etching (RIE). Thus the gate electrode 63 is formed of a conductive layer. The gate electrode 63 is patterned to extend in the Y-direction so as to be shared among a plurality of select transistors arranged along the Y-direction. In this way, the gate electrode 63 is formed on the semiconductor substrate 60 so as to function as a word line.

With the gate electrode 63 used as a mask, the source/drain diffusion layers 61A and 61B are formed in the semiconductor substrate 60. The diffusion layers 61A and 61B are formed by implanting impurities, such as arsenic (As) and phosphorus (P), into the semiconductor substrate 60 by the ion implantation method. Thereafter the insulating film 64 is formed on the side surfaces and the top surface of the gate electrode 63.

Through the foregoing processes, the select transistor Tr shown in FIG. 2 is formed.

Subsequently, as shown in FIG. 2, the first interlayer insulating film 71 is formed on the semiconductor substrate 60 so as to cover the formed select transistor by the CVD method. Then contact holes are formed in the interlayer insulating film 71 so as to expose the top surfaces of the source/drain diffusion layers 61A and 61B. The formed contact holes are filled, for example, with tungsten (W), thereby forming the contact plugs CP1 and CP2. Thereafter, using the chemical mechanical polishing (CMP) method, the top surface of the interlayer insulating film 71 is planarized, and a stopper film (not shown) is deposited on the interlayer insulating film 71.

Thereafter, the second interlayer insulating film 72 is deposited on the interlayer insulating film 71. Then, using the damascene method, the interconnects M1A and M1B are formed in the interlayer insulating film 72. Metals, such as copper (Cu) and aluminum (Al), are used for the interconnects M1A and M1B.

After a stopper film (not shown) is formed on the interlayer insulating film 72, the third interlayer insulating film 73 is formed. In the interlayer insulating film 73, the via plug V1 is buried by using the damascene method so as to be directly in contact with the interconnect M1A.

Figure 5:
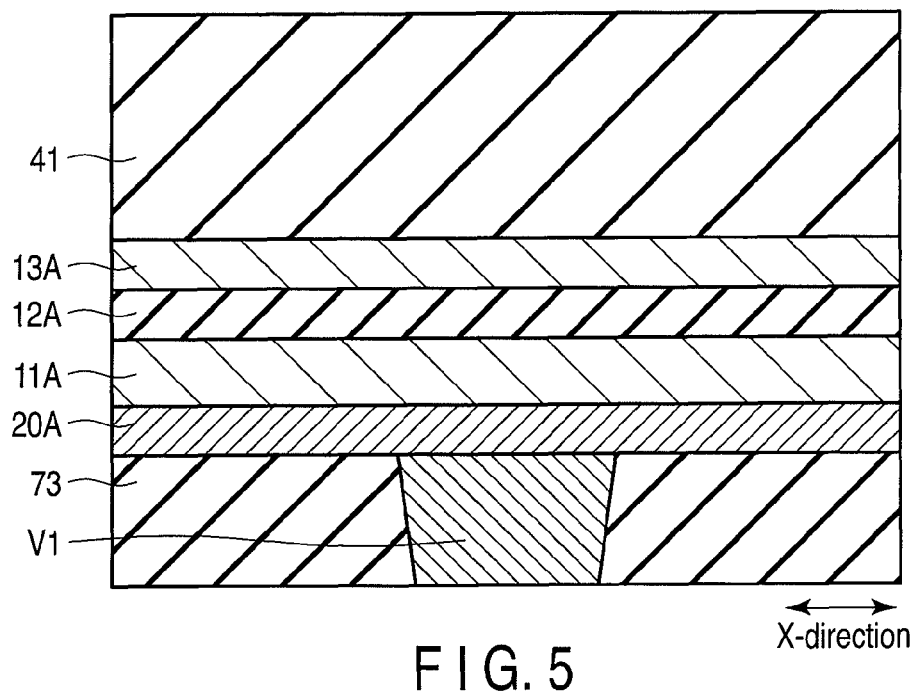
FIG. 5 is a cross-sectional view showing one process of manufacturing the magnetoresistive element according to the first embodiment.

As shown in FIG. 5, a conductive layer 20A is formed on the exposed top surface of the via plug V1, for example, by the sputtering method. Tantalum (Ta) and titanium nitride (TiN), for example, are used for the conductive layer 20A. The conductive layer 20A will become a lower electrode of a magnetoresistive element.

Then a first ferromagnetic layer 11A, an insulating film 12A and a second ferromagnetic layer 13A are sequentially deposited on the conductive layer 20A, for example, by using the sputtering method. The ferromagnetic layers 11A and 13A will become a magnetic pinned layer and a magnetic free layer of the magnetoresistive element (MTJ element), and the insulating film 12A will become a tunnel barrier layer of the magnetoresistive element. A hard mask (e.g., a silicon oxide film) 41 is deposited on the ferromagnetic layer 13A.

Figure 6:
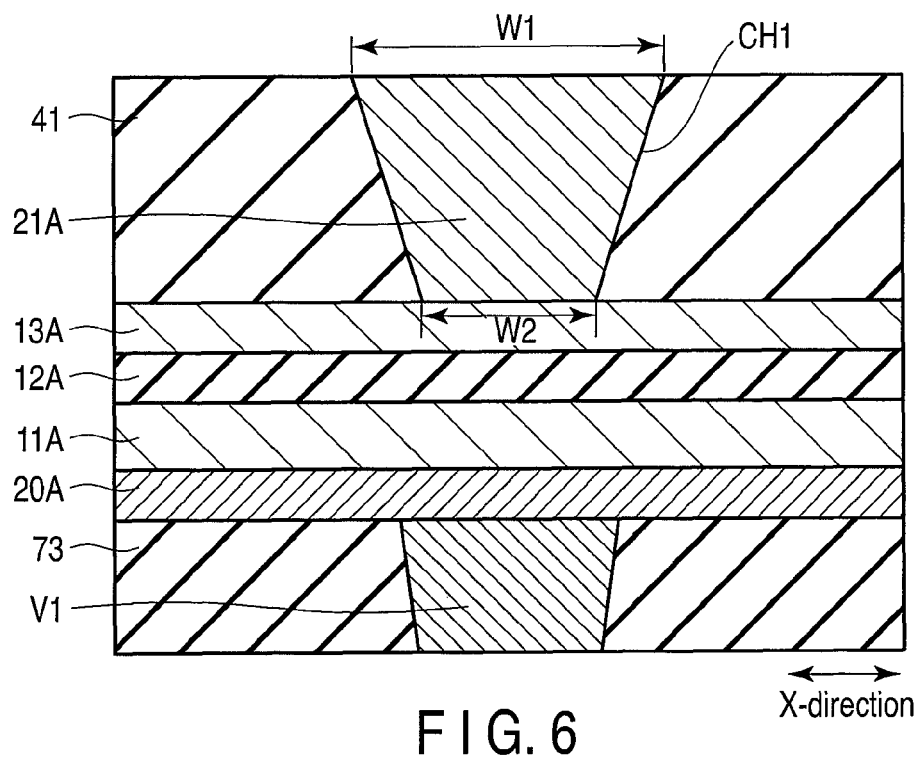
FIG. 6 is a cross-sectional view showing one process of manufacturing the magnetoresistive element according to the first embodiment.

Subsequently, as shown in FIG. 6, a contact hole CH1 is formed in the hard mask 41 by a photolithography process and the RIE method. This exposes the top surface of the ferromagnetic layer 13A. The contact hole CH1 is undercut during its formation so that a size (width) W1 in the X-direction of its upper end side is larger than a size (width) W2 in the X-direction of its lower end side (a side of the ferromagnetic layer 13A).

A conductive layer 21A is buried in the contact hole CH1 by the sputtering method or the metal organic CVD (MOCVD) method. The top surface of the conductive layer 21A is planarized by the CMP method with the top surface of the hard mask 41 used as a stopper. In the contact hole CH1, the width W1 on the upper end side is larger than the width W2 on the lower end side. Therefore the conductive layer 21A buried in the contact hole CH1 reflects the shape of the contact hole, resulting in having a tapered cross-sectional shape. The conductive layer 21A will become an upper electrode of the magnetoresistive element.

Note that it is preferable that a material used for the conductive layer 21A have a higher hardness than those of the ferromagnetic layers 11A and 13A and a low etching rate for ion milling. Examples of the material of the conductive layer 21A include titanium nitride (TiN) and tantalum (Ta).

Thereafter, the hard mask 41 is selectively removed by the chemical dry etching (CDE) method or wet etching. Then, as shown in FIG. 7, the taper-shaped conductive layer 21A remains on the ferromagnetic layer 13A. In the conductive layer 21A, the size (width) W1 on the top surface side is larger than the size (width) W2 on the bottom surface side, and therefore an angle θa formed between the side surface of the conductive layer 21A and the bottom surface of the conductive layer 21A is larger than 90°.

Figure 8:
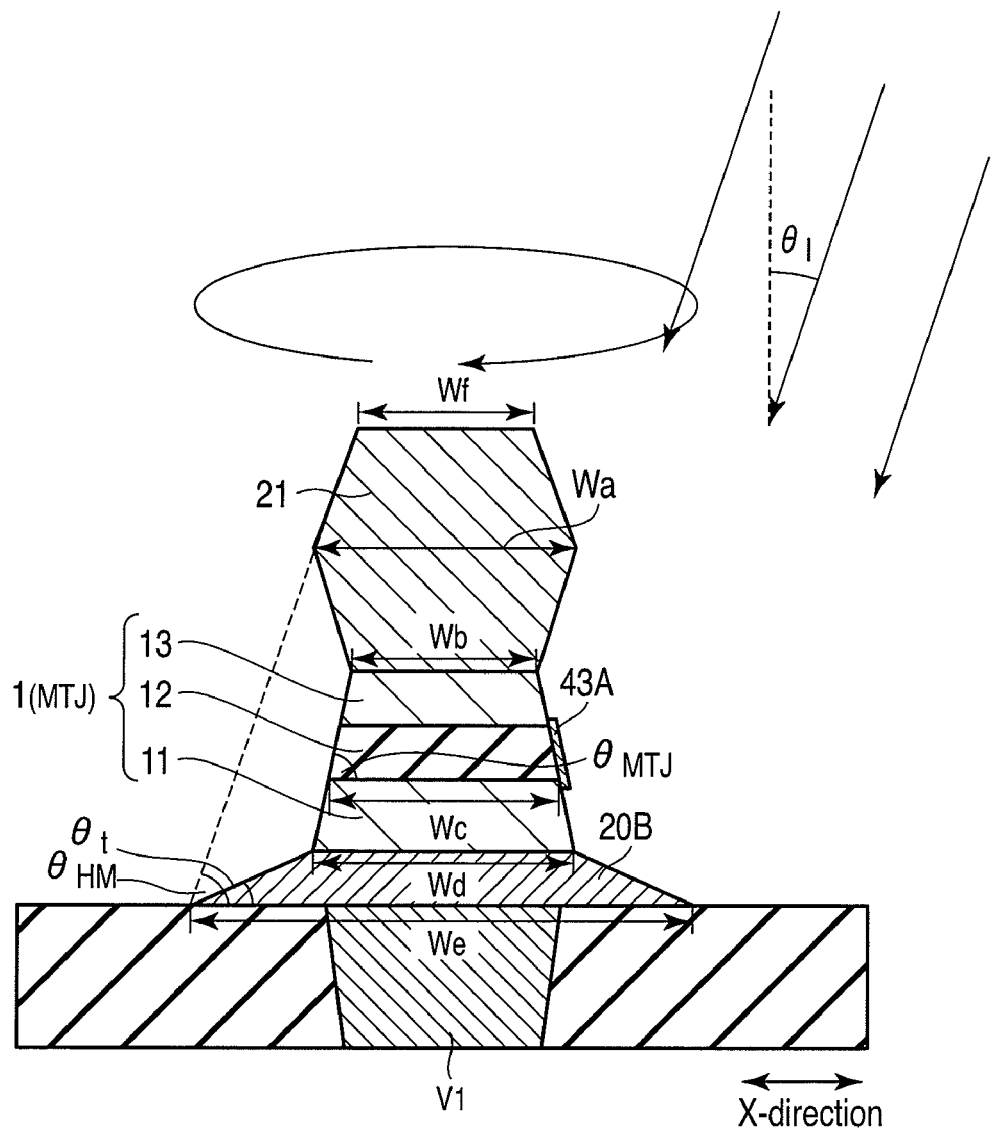
FIG. 8 is a cross-sectional view showing one process of manufacturing the magnetoresistive element according to the first embodiment.

Subsequently, the ferromagnetic layers 11A and 13A, the tunnel barrier layer 12A and the conductive layer 20A are processed for example, by using physical etching, such as ion milling, so that the ferromagnetic layers 11 and 13, the tunnel barrier layer 12 and the lower electrode 20B are obtained as shown in FIG. 8.

In ion milling used for processing in this embodiment, an angle $\theta_I$ of incidence of ions is in an oblique direction to the surface of the semiconductor substrate. The angle $\theta_I$ of incidence of ions is an angle formed between an incident direction of ions and a perpendicular direction to the surface of the semiconductor substrate. With the conductive layer 21 used as a mask, ion milling is performed while the semiconductor substrate is being rotated. Ions used for ion milling is, for example, argon (Ar).

By the ion milling, the ferromagnetic layers 11A and 13A, the tunnel barrier layer 12A and the conductive layer 20A are etched with the conductive layer 21A used as a hard mask.

At this point, corners of the top surface of the conductive layer 21A used as a hard mask are etched, so that the cross-sectional shape of the conductive layer is changed from a taper shape (trapezoid) to a hexagon. By performing processing while rotating the substrate, the planar shape of the magnetoresistive element 1 is changed, for example, to a circle or an oval.

The cross-sectional shape of the magnetoresistive element 1 becomes tapered by ion milling in an oblique direction. The size (width) Wb on the top surface (upper electrode) side of the magnetoresistive element 1 is smaller than the size (width) Wd on the bottom surface (substrate) side of the magnetoresistive element 1. Such a shape is made because processing is performed by ion milling from the oblique direction and the ferromagnetic layer 13 on the upper layer side is exposed to incident ions for a longer time than the ferromagnetic layer 11 on the lower layer side. Note that the size Wb of the top surface of the magnetoresistive element 1 is substantially the same as the size Wd of the bottom surface of the upper electrode 21. As described above, in this embodiment, an acute angle formed between the inclined side surface of the tunnel barrier layer 12 and the bottom surface of the tunnel barrier layer 12 is the taper angle $\theta_{MTJ}$ of the magnetoresistive element.

The cross-sectional shape of the lower electrode 20 becomes tapered. The size Wd on the top surface side of the lower electrode 20B is smaller than the size We on the bottom surface side of the lower electrode 20B. Note that the size of the top surface of the lower electrode 20B is substantially the same as the size of the bottom surface of the magnetoresistive element 1. As described above, in this embodiment, an acute angle formed between the inclined side surface of the lower electrode 20B and the bottom surface of the lower electrode 20B is the angle θt.

Here, a material of which the magnetoresistive element 1 is made and a material of which the lower electrode 20B is made differ from each other in etching rate for ion milling because they differ in hardness from each other. Therefore, the taper angle $\theta_{MTJ}$ of the magnetoresistive element 1 (tunnel barrier layer 12) is larger than the taper angle θt of the lower electrode 20B.

In processes shown in FIGS. 7 to 9, the shape (e.g., a ratio of W1/W2) and the film thickness of the hard mask (upper electrode) 21 are adjusted so that the size Wa along the X-direction of the hard mask (upper electrode) 21 is larger than the size, for example, its maximum size Wc, in the X-direction of the tunnel barrier layer 12. Assuming that an angle formed between a straight line joining an end of the top surface of the upper electrode 21 and an end of the bottom surface of the lower electrode 20B, after processing, and the bottom surface of the lower electrode 20B is $\theta_{HM}$, the angle of incidence of ions and the film thicknesses and sizes of the upper electrode 21 and each of the films 11 to 13 included in the magnetoresistive element are set so that the sum of the angle $\theta_{HM}$ and the angle $\theta_I$ of incidence of ions is, for example, about 90°.

By setting the angles $\theta_{HM}$ and $\theta_I$ in this way, the taper angle $\theta_{MTJ}$ of the magnetoresistive element 1 is, for example, 60° or more and 90° or less. The taper angle θt of the lower electrode is, for example, 60° or less.

Note that the angle $\theta_I$ of incidence of ions is preferably 10° or more and 50° or less; however, the angle is not necessarily limited to this value.

Here, a conductive residue 43A is adhering to the side surface of the tunnel barrier layer 12 of the magnetoresistive element 1. The cause of the conductive residue is that the lower electrode 20 and the ferromagnetic layer 11 formed below the tunnel barrier layer 12 are sputtered with ions, so that their constitution members are scattered.

Thereafter, as shown in FIG. 9, the protective film 25 is deposited on the interlayer insulating film 73, for example, by using the sputtering method with high verticality of film deposition. As the protective film 25, for example, a silicon nitride film (SiN), a silicon oxide film (SiO), magnesium oxide (MgO) and alumina (AlOx) are used.

The side surface of the lower electrode 20B is covered with the insulating film 25. On the other hand, since the sputtering method with high verticality of film deposition is used and the size Wa in the X-direction of the upper electrode 21 serving as a hard mask is larger than the size Wc in the X-direction of the tunnel barrier layer 12 in this embodiment, the insulating film 25 is hardly deposited on the side surface of the tunnel barrier layer 12. Therefore, the residue 43A is exposed. Note that the insulating film 25 is deposited on the upper electrode 21.

As shown in FIG. 10, in order to remove the residue adhering to the side surface of the magnetoresistive element 1, physical etching (ion milling) from the oblique direction is carried out again while rotating the substrate.

As mentioned above, most of the side surface of the magnetoresistive element 1 is not covered with the insulating film 25. Therefore, a conductive residue adhering to the side surface of the tunnel barrier layer 12, together with an insulating film thinly deposited on the residue, is removed from the side surface of the tunnel barrier layer 12 by ion milling.

The side surface of the lower electrode 20 is covered with the protective film 25A. Accordingly, members scattered by ion milling are of an insulating material resulting from the protective film 25. Consequently, even if scattering members caused by ion milling are deposited on the side surface of the magnetoresistive element 1 (tunnel barrier layer 12), a residue resulting from the members (insulating material) never causes a short circuit between the two ferromagnetic layers 11 and 13.

The angle of incidence of ions in ion milling for removing the residue may be the same as the angle $\theta_I$ of incidence of ions in a process shown in FIG. 8 or may be different from the angle $\theta_I$ if ions can be applied to the tunnel barrier layer 12.

Note that, as shown in FIG. 10, the protective film 25A is etched by ion milling, and therefore a junction between the ferromagnetic layer 11 and the lower electrode 20 is sometimes exposed. In this case, after the tunnel barrier layer is covered with the residue resulting from the protective film 25, the lower electrode 20 is sputtered, so that its members are scattered. Therefore, a short circuit between the ferromagnetic layers does not occur.

Thereafter, as shown in FIG. 11, using the sputtering method or the CVD method from an oblique direction, the protective film 27 is deposited on the side surface of the magnetoresistive element 1 and on the side surfaces of the lower and upper electrodes 20 and 21. Note that, for the protective film 27, for example, a silicon nitride film is used. The protective film 27 may have a double-layer structure made up of a silicon nitride film deposited by the sputtering method and a silicon nitride film deposited by the CVD method.

As shown in FIG. 3, the interlayer insulating film 74 is deposited so as to improve buriability between elements adjacent to each other by the high-density-plasma (HDP) CVD method or the like. A silicon oxide film, for example, is used for the interlayer insulating film 74.

After the top surface of the interlayer insulating film 74 is planarized by the CMP method, the interlayer insulating film 74 is etched-back by the RIE method, the ion milling method or the like. This etch-back exposes an upper portion of the upper electrode 21. At this point, part of the insulating film 25B may be left, or the whole insulating film 25B may be removed. Thus, the bit line BL extending in the X-direction is formed on the upper electrode 21.

Through the foregoing processes, the magnetoresistive element 1 of this embodiment and a memory cell which uses the magnetoresistive element 1 are completed.

According to a method of manufacturing a magnetoresistive element according to the first embodiment of the invention, a hard mask (upper electrode) for processing a magnetoresistive element is formed so that the size (width) in the X-direction of the hard mask is larger than the size (width) in the X-direction of a tunnel barrier layer of the magnetoresistive element. As a result, a residue adhering to the side surface of the tunnel barrier layer 12 can be effectively removed even if the angle $\theta_{MJT}$ is 60° or more and less than 90°. This can contribute to miniaturization of a magnetoresistive element.

Accordingly, a method of manufacturing a magnetoresistive element according to the first embodiment of the invention can provide a magnetoresistive element in which improvement in reliability is compatible with device miniaturization.

(3) Effects

Figure 12:
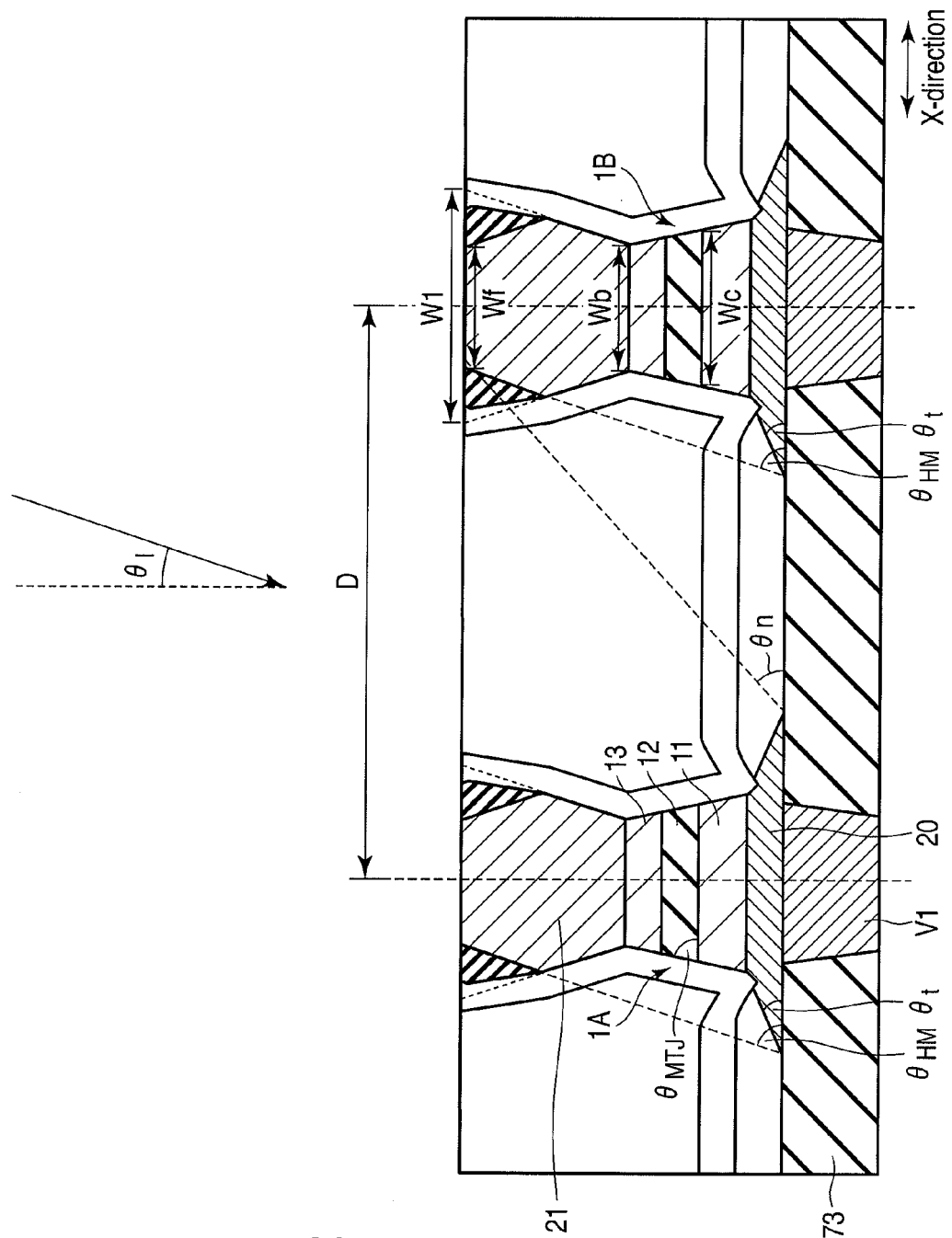
FIG. 12 is an explanatory diagram of en effect of the magnetoresistive element according to the first embodiment.

Referring to FIGS. 12 and 13, effects of this embodiment is described.

For example, in ion milling used for a process of manufacturing a device using one magnetoresistive element, such as a read magnetic head of a hard disk, the distance between the magnetoresistive elements adjacent to each other is sufficient, and therefore there is little restriction on the angle $\theta_I$ of incidence of ions used for ion milling.

On the other hand, as shown in FIGS. 1 and 12, in a magnetic random access memory (MRAM) in which the memory cell array 100 is configured by using a plurality of magnetoresistive elements 1A and 1B, a plurality of memory cells MC needs to be arranged on a chip (semiconductor substrate) with high density in order to improve the storage capacity without increasing the size of the chip. In other words, in order to achieve an MRAM with high density in which the chip size is small and the storage capacity is large, an interval D between the magnetoresistive elements 1A and 1B adjacent to each other needs to be decreased as shown in FIG. 12.

For example, as shown in FIG. 12, in the two magnetoresistive elements 1A and 1B adjacent to each other, it is assumed that an angle formed by a straight line joining an end of the bottom surface of the lower electrode 20A of one magnetoresistive element 1A and an end of the top surface of an upper electrode 21B of the other magnetoresistive element 1B relative to the surface of the interlayer insulating film 73 is θn. In this case, the decrease in the interval D results in increase in the angle θn.

In processes of manufacturing the magnetoresistive element 1, the angle $\theta_I$ of incidence of ions of ion milling is defined by an angle formed between an incident direction of ions and a perpendicular direction to the surface of the semiconductor substrate. The decrease in the interval D imposes a restriction on the angle $\theta_1$ of incidence of ions.

In a spin transfer MRAM which reverses the magnetization direction of a ferromagnetic layer using a magnetic memory, particularly STT, reducing the current density of a threshold current for reversing the magnetization direction (hereinafter referred to as a "reverse threshold current") is demanded. For the purpose of reduction in reverse threshold current, it is discussed to use a magnetoresistive element of a double-junction structure. In the magnetoresistive element of the double-junction structure, since the number of laminated films increases, the film thickness of the whole magnetoresistive element increases. The increase in the film thicknesses of the whole magnetoresistive elements 1A and 1B causes increase in the angle θn and the angle $\theta_{HM}$.

As a result of this, the angle $\theta_I$ of incidence of ions of ion milling is further restricted to a smaller angle.

In the magnetoresistive element 1 of this embodiment, the maximum size (width) Wa in the X-direction of the upper electrode 21 is larger than the size Wb in the X-direction of the tunnel barrier layer 12.

In this embodiment, the sum of the taper angle $\theta_{HM}$ and the angle $\theta_I$ of incidence of ions is set to be approximately 90°. The taper angle $\theta_{MTJ}$ and the taper angle $\theta_{HM}$ are set to be larger than the taper angle θt. Note that, in this embodiment, the angle $\theta_{HM}$ is set to be larger than the angle θn.

In the method of manufacturing a magnetoresistive element which has been described with reference to FIGS. 5 to 11, the upper electrode 21 and the tunnel barrier layer 12 are processed so that the maximum value Wa of the size along the X-direction of the upper electrode 21 after processing is larger than the size Wc along the X-direction of the tunnel barrier layer 12. By using the sputtering method with high verticality of film deposition, the protective film 25A is deposited on the side surface of the lower electrode 20. This makes it possible to avoid the case where the tunnel barrier layer 12 is covered with the protective film 25A with a conductive residue adhering to the tunnel barrier layer 12. Therefore, according to this embodiment, a conductive residue adhering to the tunnel barrier layer 12 can be easily removed by ion milling from an oblique direction. During the residue removal, the residue resulting from the lower electrode 20 never adheres to the side surface of the magnetoresistive element 1 because the lower electrode 20 is covered with a protective film made of an insulating film. Thus, a short circuit between two ferromagnetic layers 11 and 13, which are included in a magnetoresistive element, can be prevented. This improves reliability of the formed magnetoresistive element. The reliability of a circuit (e.g., MRAM) using the magnetoresistive element can also be improved. In addition, with the structure of a magnetoresistive element of this embodiment, removing the residue from the side surface of the magnetoresistive element 1 is easy, and therefore restrictions on the angle $\theta_I$ of incidence of ions can be eased.

Furthermore, according to this embodiment, the taper angle $\theta_{MTJ}$ of the magnetoresistive element 1 can be set to be 60° or more. It is therefore unnecessary to increase a relative size of the bottom surface to the top surface of a magnetoresistive element in order to set the taper angle of the magnetoresistive element to be 60° or less. Therefore the size of the magnetoresistive element 1 can be decreased.

Referring to FIG. 13, the size of a magnetoresistive element by a physical simulation in the case of using ion milling with angles of incidence of Ar ions of 20° and 40° is described.

A magnetoresistive element used in the simulation is made up of the following members.

Titanium nitride (TiN) is used for the lower electrode 20, and its film thickness is 30 nm. Any one of iron (Fe), cobalt (Co), boron (B) and the like is used for a magnetic free layer (e.g., the ferromagnetic layer 11), and its film thickness is 2 nm. Magnesium oxide (MgO) having a film thickness of 1 nm is used for the tunnel barrier layer 12. Any one of iron (Fe), cobalt (Co) and boron (B) is used for a magnetic pinned layer (e.g., the ferromagnetic layer 13), and its film thickness is 30 nm. Titanium nitride (TiN) is used for the upper electrode 21, and its film thickness is 50 nm. The upper electrode 21 has a circular, planar shape.

Here, Δx corresponding to the horizontal axis of FIG. 13 represents a one-sided difference between the size W1 in the X-direction of the top surface of the upper electrode 21 and the size Wb in the X-direction of the bottom surface of the upper electrode 21, before processing, in FIG. 12.

The conversion difference corresponding to the vertical axis of FIG. 13 is a value obtained by subtracting the size (width) W1 in the X-direction of the top surface of the upper electrode 21 before processing from the size (maximum width) Wc in the X-direction of the tunnel barrier layer 12 of the magnetoresistive element 1 after processing.

In FIG. 13, the value of Δx=0 represents the case where the size W1 of the top surface and the size Wb of the bottom surface in the upper electrode 21 before processing are the same.

As shown in FIG. 13, by increasing the value of Δx, that is, making the cross-sectional shape of the upper electrode in an undercut shape, in which the size on the top surface (upper electrode) side is larger than the size on the bottom surface (substrate) side, the conversion difference can be decreased. The size of the tunnel barrier layer included in the magnetoresistive element is therefore decreased. The ferromagnetic layers included in the magnetoresistive element are processed simultaneously with the tunnel barrier layer. Therefore, as a matter of course, the sizes of the ferromagnetic layers are also decreased.

In this way, with a magnetoresistive element and a method of manufacturing the magnetoresistive element according to the first embodiment of the invention, miniaturization of a magnetoresistive element can be achieved.

Accordingly, a magnetoresistive element and a method of manufacturing the magnetoresistive element according to the first embodiment of the invention allow compatibility of improvement in reliability with device miniaturization.

2. Second Embodiment

Referring to FIGS. 14 to 19, a second embodiment of the invention is described below. Note that, in the second embodiment, components identical or equivalent to those described in the first embodiment are indicated by the same reference characters, and their detailed descriptions are given as necessary.

(1) Structure

Referring to FIG. 14, a structure of a magnetoresistive element according to the second embodiment of the invention is described.

FIG. 14 shows a structure of a magnetoresistive element according to this embodiment. Configurations of a memory cell and a memory cell array in which the magnetoresistive element is used are the same as those shown in FIGS. 1 and 2, and therefore their descriptions are omitted here.

As shown in FIG. 14, in the magnetoresistive element 1 of this embodiment, the structure of the upper electrode 21Y differs from that of a magnetoresistive element of the first embodiment.

In this embodiment, the cross-sectional shape along the X-direction of the upper electrode 21Y is quadrilateral. The cross-sectional shape along the X-direction of the upper electrode 21Y will be acceptable as long as it is quadrilateral. The cross-sectional shape may be square and may also be tapered (trapezoidal). Note that the planar shape of the upper electrode 21Y is, for example, circular or oval.

The size (width) $W_O$ in the X-direction of the upper electrode 21Y is, for example, substantially the same as the size in the X-direction of the ferromagnetic layer 13. That is, the size $W_O$ in the X-direction of the upper electrode 21Y is smaller than the size We in the X-direction of the tunnel barrier layer 12.

With a magnetoresistive element in this embodiment, improvement in reliability is compatible with device miniaturization, as in the first embodiment, by using the following method of manufacturing a magnetoresistive element.

(2) Manufacturing Method

Referring to FIGS. 14 to 18, a method of manufacturing a magnetoresistive element according to the second embodiment of the invention is described below.

Initially, like the first embodiment, a select transistor included in a memory cell is formed on the semiconductor substrate 60. Interlayer insulating films are deposited so as to cover the select transistor on the semiconductor substrate, and plugs or interconnects are formed in each interlayer insulating film.

Next, as shown in FIG. 15, like the processes described referring to FIG. 5, the conductive layer 20A, the ferromagnetic layer 11A, the tunnel barrier layer 12A and the ferromagnetic layer 13A are sequentially deposited on the interlayer insulating film 73. Subsequently, a conductive layer 21X, which will become an upper electrode, is deposited on the ferromagnetic layer 13. As a material of the conductive layer 21X, for example, titanium nitride (TiN), tantalum or the like is used.

Two mask layers 41A and 42A are deposited on the conductive layer 21X, for example, by the CVD method. For example, a silicon oxide film is used for the mask layer 41A, and a silicon nitride film is used for the mask layer 42A. However, the two mask layers 41A and 42A are not limited to a silicon oxide film and a silicon nitride film as long as they are different materials which can ensure an etching selectivity.

As shown in FIG. 16, a circular pattern is transferred onto the mask layer 42A by a photolithography technique. On the basis of the transferred pattern, the two mask layers 41A and 42A are processed by the RIE method. Thus, cylindrical hard masks 41A and 42A are formed. Note that the shape of the hard mask is not limited to a cylinder, and may be a prism.

Next, using wet etching or the CDE method, the hard mask 41A is selectively etched. This causes a size (width) W4 in the X-direction of the hard mask (silicon oxide film) 41A to be smaller than a size (width) W3 in the X-direction of the hard mask (silicon nitride film) 42A.

Subsequently, as shown in FIG. 17, like the process shown in FIG. 8 of the first embodiment, conductive layers and ferromagnetic layers are etched while the semiconductor substrate is being rotated, by using ion milling in which ions are incident from an oblique direction. This causes the magnetoresistive element 1, the lower electrode 20 and the upper electrode 21Y to be formed above the interlayer insulating film 73. A tilt angle $\theta_{MTJ}$ of the side surface of the formed magnetoresistive element 1, a tilt angle $\theta t$ of the side surface of the lower electrode 20, and the sizes Wc, Wd and We in the X-direction are the same as in the first embodiment.

In order that the size W3 in the X-direction of the hard mask 42A, or the uppermost layer, is larger than the size Wc in the X-direction of the tunnel barrier layer 12, a mask layer is processed in a process shown in FIG. 16.

A conductive residue 43B, which results from a ferromagnetic layer and a conductive layer, adheres to the vicinity of a junction surface of the hard mask 41A and the hard mask 42A. The conductive residue 43A sometimes adheres to the side surface of the tunnel barrier layer 12.

As shown in FIG. 18, like the process shown in FIG. 9 of the first embodiment, a protective film 25 is deposited on the side surface of the lower electrode 20 by using the sputtering method with high verticality of film deposition. At this point, the insulating film 25 is not deposited on the side surface of the magnetoresistive element 1 because of a mask 42A having the size W3 larger than the size Wc in the X-direction of the tunnel barrier layer 12 is formed above the magnetoresistive element 1 and the deposition of the protective film 25 using the sputtering method with high verticality. The side surface of the magnetoresistive element 1 and the residue of the side surface are therefore exposed.

Figure 19:
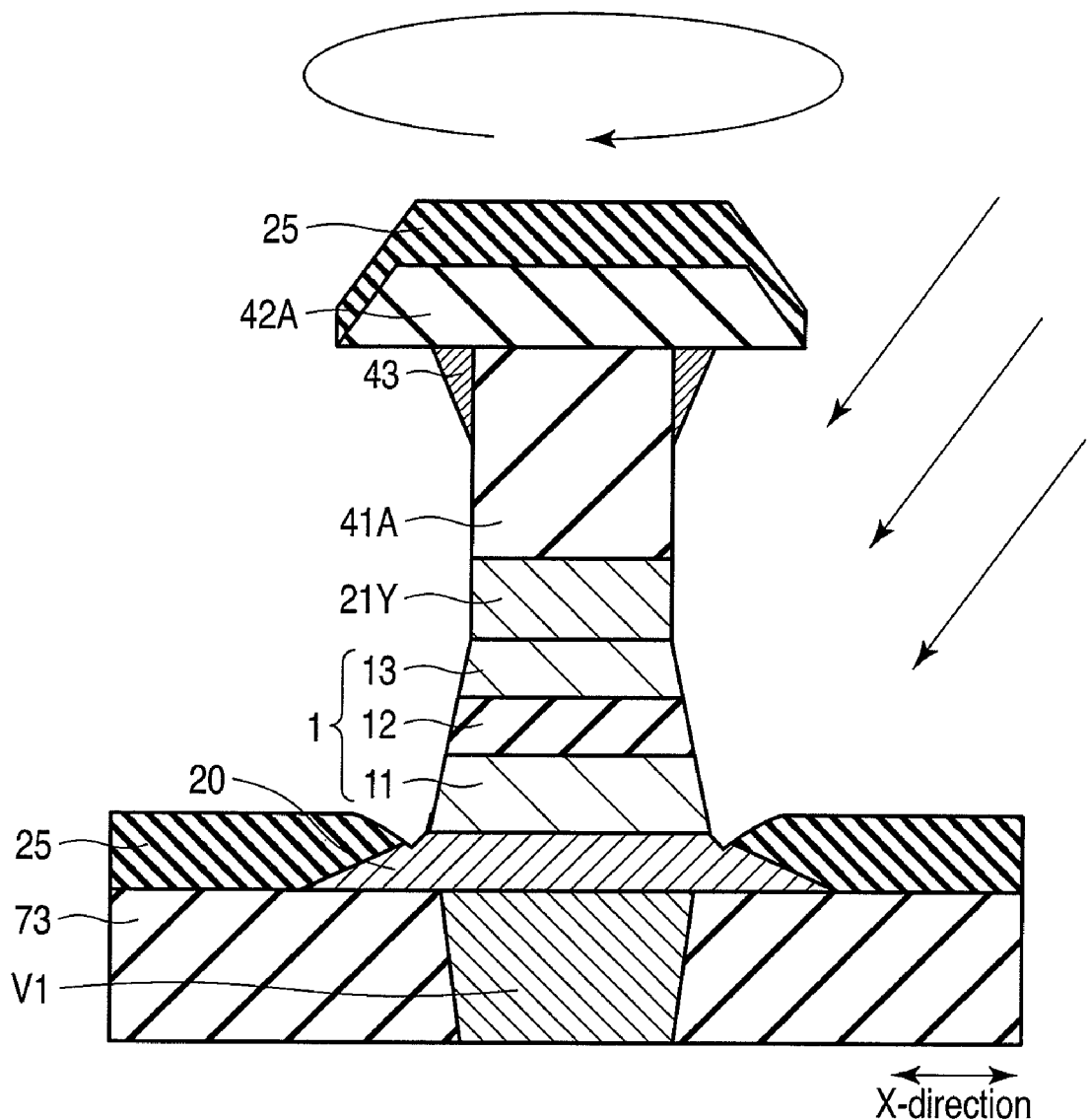
FIG. 19 is a cross-sectional view showing one process of manufacturing the magnetoresistive element according to the second embodiment.

As shown in FIG. 19, like the process shown in FIG. 10 of the first embodiment, the conductive residue adhering to the side surface of the magnetoresistive element 1 is removed by ion milling from the oblique direction. Since the lower electrode 20 is covered with a protective film made of an insulating film, a conductive residue resulting from the lower electrode 20 never adheres to the side surface of the magnetoresistive element 1 (tunnel barrier layer 12) during the removal of the residue.

After the protective film 27 is formed, the mask layers 41A and 42A are peeled off. Then the interlayer insulating film 74 and the bit line (interconnect) BL are sequentially formed. Through the foregoing manufacturing processes, a magnetoresistive element shown in FIG. 14 is formed.

In the second embodiment of the invention, the hard masks for forming the magnetoresistive element 1 are made of two insulating films such that the size W3 in the X-direction of the hard mask 42A on the upper side is larger than the size W4 in the X-direction of the hard mask 41A on the lower side (substrate side).

In this case, at the time of removing the residue from the side surface of the tunnel barrier layer 12, the lower electrode 20 is covered with an insulating film, and the side surface of the tunnel insulating layer 12 and the residue on the side surface are exposed. Therefore, according to this embodiment, the conductive residue can be effectively removed from the side surface of the tunnel insulating layer 12, enabling prevention of a short circuit between the two ferromagnetic layers 11 and 13.

Removing the residue on the side surface of the tunnel barrier layer 12 by using the above approach enables the taper angle $\theta_{MTJ}$ of the magnetoresistive element to be 60° or more and less than 90°. Therefore, according to this embodiment, miniaturization of the magnetoresistive element 1 can be achieved.

Accordingly, in a magnetoresistive element according to the second embodiment of the invention, improvement in reliability of a magnetoresistive element is compatible with device miniaturization, as in a magnetoresistive element according to the first embodiment.

3. Third Embodiment

Referring to FIG. 20, a structure of a magnetoresistive element according to a third embodiment of the invention is described. Note that, in the third embodiment, components identical or equivalent to those described in the first embodiment are indicated by the same reference characters, and their detailed descriptions are given as necessary.

In the first and second embodiments, the structure of the magnetoresistive element 1 is a three-layer structure in which three films are laminated. However, the structure of the magnetoresistive element is not limited to the three-layer structure and may be a laminated structure including four or more layers.

As shown in FIG. 20, a magnetoresistive element 10 may have a double-junction structure. The magnetoresistive element 10 of the double-junction structure comprises a ferromagnetic layer of a first magnetic pinned layer 11X, a first tunnel barrier layer 12X, a ferromagnetic layer of the magnetic free layer 13, a second tunnel barrier layer 12Y, and a ferromagnetic layer of a second magnetic pinned layer 11Y.

The first tunnel barrier layer 12X is interposed between the first magnetic pinned layer 11X and the magnetic free layer 13. The second tunnel barrier layer 12Y is interposed between the second magnetic pinned layer 11Y and the magnetic free layer 13. In other words, the magnetoresistive element 10 has a structure in which the magnetic free layer is sandwiched by the two tunnel barrier layers 12X and 12Y and the two magnetic pinned layers 11X and 11Y, having two tunnel junctions.

The magnetoresistive element 10 of a double-junction structure enables reduction of current density of its reverse threshold current.

The structure of a magnetoresistive element is not limited to that of FIG. 20, and two ferromagnetic layers, which function as a magnetic pinned layer and a magnetic free layer, may include a cap layer between them and an electrode.

Alternatively, the structure may be such that an antiferromagnetic layer is provided so that a magnetic pinned layer has, on its side not in contact with a tunnel barrier layer, an interface with the antiferromagnetic layer. In cases where an antiferromagnetic layer is provided, exchange bias coupling occurs between the antiferromagnetic layer and a magnetic pinned layer to improve the coercive force of the magnetic pinned layer. A magnetic pinned layer of a laminated structure in which a ruthenium (Ru) layer is sandwiched by two ferromagnetic layers may be employed for a magnetoresistive element.

In the magnetoresistive element mentioned here, the number of laminated films included in the magnetoresistive element is increased. Therefore, the number of deposition processes of films is increased. However, a method of manufacturing a magnetoresistive element is substantially the same as those described in the first and second embodiments. Thus, a description of a method of manufacturing a magnetoresistive element in this embodiment is omitted.

These magnetoresistive elements can contribute to improvement in characteristics of a magnetoresistive element. However, in each structure of a magnetoresistive element described in this embodiment, the number of laminated films included in the magnetoresistive element increases, and therefore the film thickness (height) of the magnetoresistive element increases.

Therefore, the angle θn shown in FIG. 12 increases. Particularly in the magnetoresistive element 10 of a double-junction structure shown in FIG. 20, the increase in the angle θn is remarkable. With the remarkable increase in the angle θn, the taper angle $\theta_{HM}$ increases. As such, it is anticipated that the incident angle of Ar ions in ion milling is restricted to a small angle.

Nevertheless, in the magnetoresistive element shown in FIG. 20, the size Wa along the X-direction of the upper electrode 21 is larger than the size Wc along the X-direction of the tunnel barrier layer 12X. Note that, in the magnetoresistive element 10 of the double-junction structure, the size Wa of the upper electrode 21 is larger than the size of the tunnel barrier layer 12X on the lower side (substrate side) of the two tunnel barrier layers 12X and 12Y.

Thus, at the time of forming the magnetoresistive element shown in FIG. 20, the use of the same manufacturing method as those described in the first or second embodiments enables both removal of a residue adhering to the side surface of the magnetoresistive element 10 and device miniaturization even if the incident angle of ions in ion milling becomes smaller.

Accordingly, the third embodiment of the invention can obtain the same effects as the first and second embodiments, and can contribute to improvement in device characteristics of a magnetoresistive element.

4. Others

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a lower electrode on an insulating layer on a semiconductor substrate;
a first ferromagnetic layer on the lower electrode;
a first tunnel barrier layer on the first ferromagnetic layer;
a second ferromagnetic layer on the first tunnel barrier layer;
an upper electrode on the second ferromagnetic layer;
an insulating first protective film on a side surface of the lower electrode, formed by a first deposition; and
a second protective film, formed by a second deposition that is distinct from the first deposition, on side surfaces of the first and second ferromagnetic layers, on a side surface of the first tunnel barrier layer, and on the first protective film, a thickness of the second protective film being different from a thickness of the first protective film,
wherein the upper electrode has a substantially hexagonal cross-sectional shape,
a portion of the upper electrode having a maximum dimension in a first direction is located below a top surface of the upper electrode and above a bottom surface of the upper electrode, the first direction being horizontal relative to a surface of the semiconductor substrate, and
the maximum dimension in the first direction of the upper electrode is larger than a maximum dimension in the first direction of the first tunnel barrier layer.

2. The magnetoresistive element according to claim 1, wherein the second protective film is in contact with an end of a junction of the lower electrode and the second ferromagnetic layer.

3. The magnetoresistive element according to claim 1, wherein the second protective film is in contact with the side surfaces of the first and second ferromagnetic layers, a side surface of the first tunnel barrier layer, and a first portion of the upper electrode located below the portion of the upper electrode having the maximum dimension.

4. The magnetoresistive element according to claim 3, further comprising a third protective film on a second portion of the upper electrode above the portion of the upper electrode having the maximum dimension,
wherein the third protective film is directly in contact with the second portion.

5. The magnetoresistive element according to claim 4, wherein the second protective film is configured to cover the second portion with the third protective film interposed.

6. The magnetoresistive element according to claim 4, wherein the third protective film is made of the same material as the first protective film.

7. The magnetoresistive element according to claim 1, wherein a first angle between a side surface of the first tunnel barrier layer and a bottom surface of the first tunnel barrier layer is larger than a second angle between a side surface of the lower electrode and a bottom surface of the lower electrode.

8. The magnetoresistive element according to claim 7, wherein the bottom surface of the lower electrode and a straight line joining an end of a top surface of the upper electrode and an end of the bottom surface of the lower electrode form a third angle with the bottom surface of the lower electrode, wherein the third angle is an acute angle greater than or equal to the second angle.

9. The magnetoresistive element according to claim 7, wherein the first angle is between 60° and 90°.

10. The magnetoresistive element according to claim 1, wherein a dimension of the second ferromagnetic layer in the first direction is smaller than a dimension of the first ferromagnetic layer in the first direction.

11. The magnetoresistive element according to claim 1, wherein the lower electrode has a tapered cross-sectional shape.

12. The magnetoresistive element according to claim 1, wherein the second ferromagnetic layer has a circular or oval planar shape.

13. The magnetoresistive element according to claim 1, wherein the maximum dimension in the first direction of the upper electrode is larger than dimensions in the first direction of the top surface and the bottom surface of the upper electrode.

* * * * *